US010192878B1

(12) United States Patent
Tsutsumi et al.

(10) Patent No.: US 10,192,878 B1
(45) Date of Patent: Jan. 29, 2019

(54) THREE-DIMENSIONAL MEMORY DEVICE WITH SELF-ALIGNED MULTI-LEVEL DRAIN SELECT GATE ELECTRODES

(71) Applicant: SANDISK TECHNOLOGIES LLC, Plano, TX (US)

(72) Inventors: Masanori Tsutsumi, Yokkaichi (JP); Shinsuke Yada, Yokkaichi (JP); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/704,286

(22) Filed: Sep. 14, 2017

(51) Int. Cl.
*H01L 27/1157* (2017.01)
*H01L 27/11556* (2017.01)
(Continued)

(52) U.S. Cl.
CPC .. *H01L 27/11556* (2013.01); *H01L 21/76801* (2013.01); *H01L 21/76877* (2013.01);
(Continued)

(58) Field of Classification Search
CPC ............ H01L 27/11519–27/11524; H01L 27/11551–27/11556; H01L 27/11565–27/1157; H01L 27/11578–27/11582; H01L 29/6653; H01L 29/66553; H01L 29/6656; H01L 21/76224; H01L 21/76232; H01L 21/76877; H01L 21/76879
See application file for complete search history.

(56) References Cited

U.S. PATENT DOCUMENTS 5,915,167 A  6/1999 Leedy
8,349,681 B2  1/2013 Alsmeier et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Marc Armand
*Assistant Examiner* — Younes Boulghassoul
(74) *Attorney, Agent, or Firm* — The Marbury Law Group PLLC

(57) ABSTRACT

Sacrificial memory opening fill structures are formed through an alternating stack of insulating layers and sacrificial material layers. A drain select level isolation trench extending through drain select level sacrificial material layers is formed employing a combination of a photoresist layer including a linear opening and a pair of rows of sacrificial memory opening fill structures as an etch mask. Sacrificial spacers are formed on sidewalls of the drain select level isolation trench. A drain select level isolation dielectric structure is formed in a remaining volume of the drain select level isolation trench. The sacrificial memory opening fill structures are replaced with memory stack structures. The sacrificial material layers and the sacrificial spacers are replaced with a conductive material to form electrically conductive layers and conductive connector spacers. The drain select level isolation dielectric structure is self-aligned to the memory stack structures and divides drain select level electrically conductive layers.

12 Claims, 35 Drawing Sheets

(51) Int. Cl.
*H01L 21/768* (2006.01)
*H01L 27/11565* (2017.01)
*H01L 27/11582* (2017.01)
*H01L 27/11519* (2017.01)
*H01L 27/11524* (2017.01)

(52) U.S. Cl.
CPC .... *H01L 27/1157* (2013.01); *H01L 27/11519* (2013.01); *H01L 27/11524* (2013.01); *H01L 27/11565* (2013.01); *H01L 27/11582* (2013.01)

(56) References Cited

U.S. PATENT DOCUMENTS

| | | | |
|---|---|---|---|
| 9,023,719 | B2 | 5/2015 | Pachamuthu et al. |
| 9,305,932 | B2 | 4/2016 | Kanakamedala et al. |
| 9,368,509 | B2 | 6/2016 | Pang et al. |
| 9,449,983 | B2 | 9/2016 | Yada et al. |
| 9,530,787 | B2 * | 12/2016 | Tsutsumi .......... H01L 27/11575 |
| 9,576,966 | B1 | 2/2017 | Peri et al. |
| 9,679,907 | B1 | 6/2017 | Kaneko |
| 9,972,641 | B1 * | 5/2018 | Zhang .............. H01L 27/11582 |
| 2012/0248525 | A1 * | 10/2012 | Lee ................... H01L 27/11582 257/324 |
| 2015/0179662 | A1 | 6/2015 | Makala et al. |
| 2015/0380419 | A1 | 12/2015 | Gunji-Yoneoka et al. |
| 2016/0111438 | A1 | 4/2016 | Tsutsumi et al. |
| 2016/0204117 | A1 | 7/2016 | Liu et al. |
| 2016/0204122 | A1 | 7/2016 | Shoji et al. |
| 2016/0307915 | A1 | 10/2016 | Pang et al. |
| 2016/0351497 | A1 | 12/2016 | Peri et al. |
| 2017/0084618 | A1 | 3/2017 | Peri et al. |
| 2017/0084623 | A1 | 3/2017 | Sharangpani et al. |
| 2017/0092733 | A1 | 3/2017 | Makala et al. |
| 2017/0148808 | A1 | 5/2017 | Nishikawa et al. |
| 2017/0148809 | A1 | 5/2017 | Nishikawa et al. |
| 2017/0148811 | A1 | 5/2017 | Zhang et al. |
| 2017/0236896 | A1 * | 8/2017 | Lu ....................... H01L 29/0649 257/314 |

OTHER PUBLICATIONS

Maeda et al., "Multi-Stacked 1G Cell/Layer Pipe-Shaped BiCS Flash Memory," 2009 Symposium on VLSI Technology Digest of Technical Papers, pp. 22-23.
U.S. Appl. No. 15/078,555, filed Mar. 23, 2016, Sandisk Technologies LLC.
U.S. Appl. No. 15/286,063, filed Oct. 5, 2016, Sandisk Technologies LLC.
U.S. Appl. No. 15/354,067, filed Nov. 17, 2016, Sandisk Technologies LLC.
U.S. Appl. No. 15/354,795, filed Nov. 17, 2016, Sandisk Technologies LLC.
U.S. Appl. No. 15/468,732, filed Mar. 24, 2017, Sandisk Technologies LLC.
U.S. Appl. No. 15/496,359, filed Apr. 25, 2017, Sandisk Technologies LLC.
U.S. Appl. No. 15/628,495, filed Jun. 20, 2017, Sandisk Technologies LLC.
U.S. Appl. No. 15/685,254, filed Aug. 24, 2017, Sandisk Technologies LLC.
International Search Report and Written Opinion of the International Searching Authority for International Patent Application No. PCT/US2018/035351, dated Oct. 9, 2018, 15 pages.

* cited by examiner

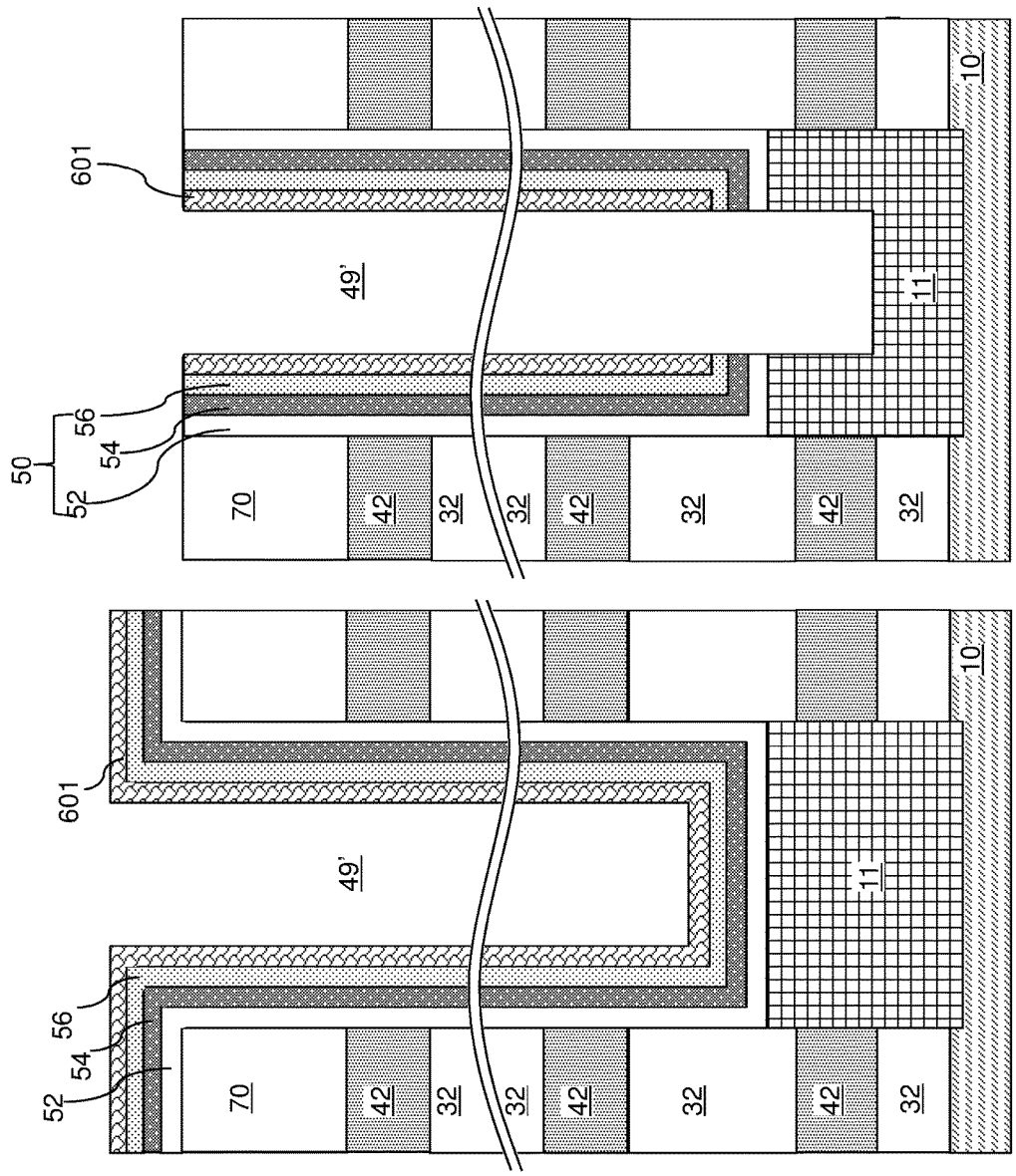

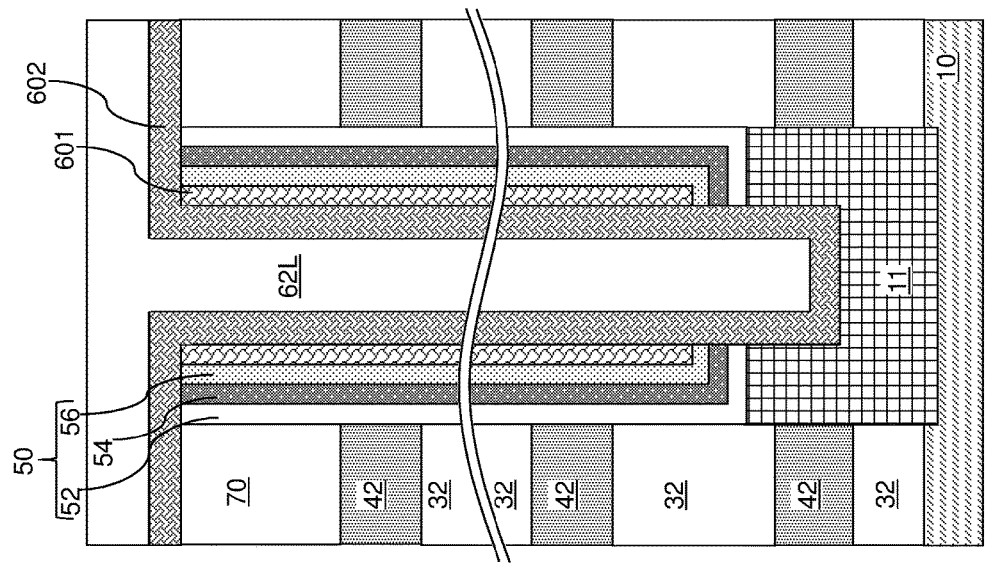
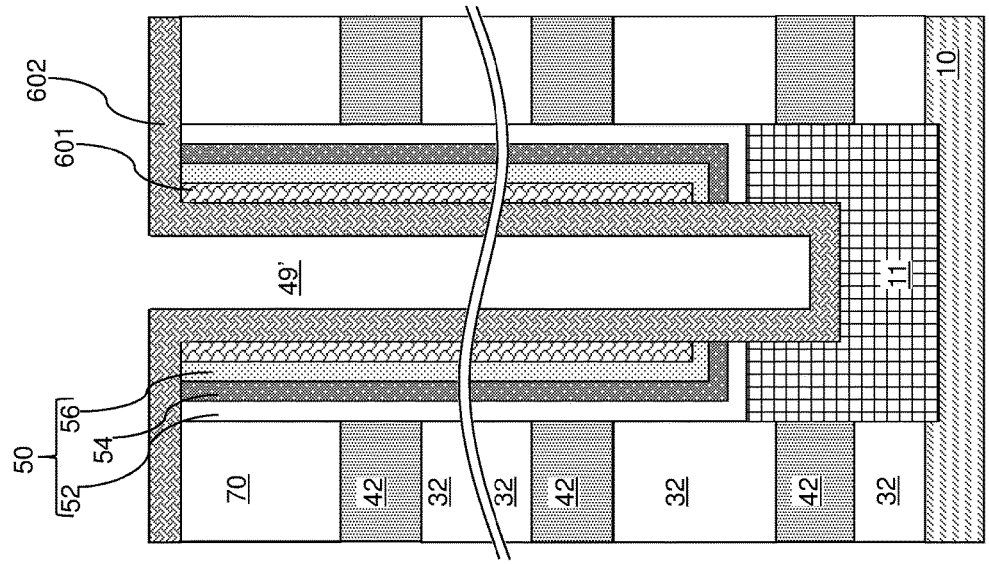

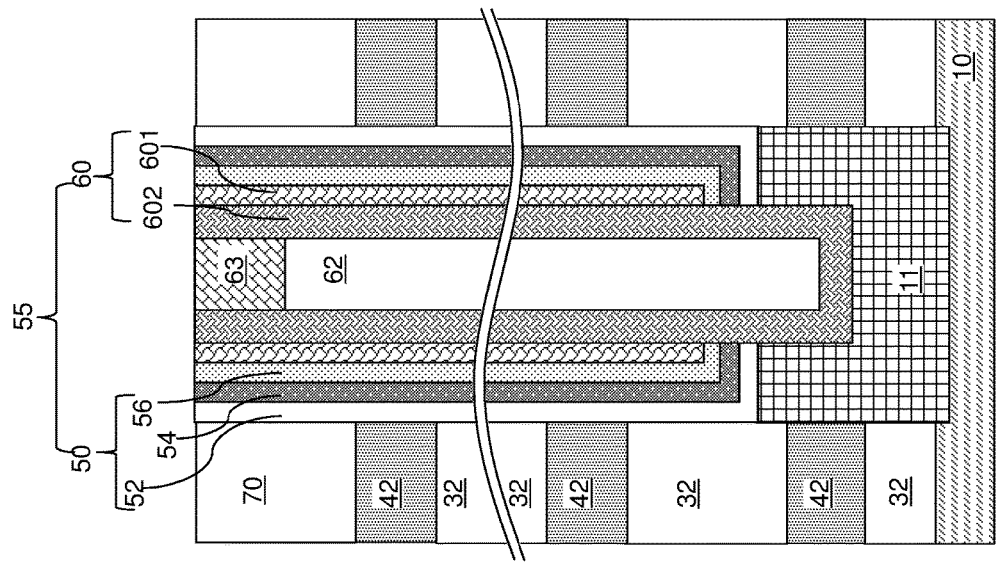
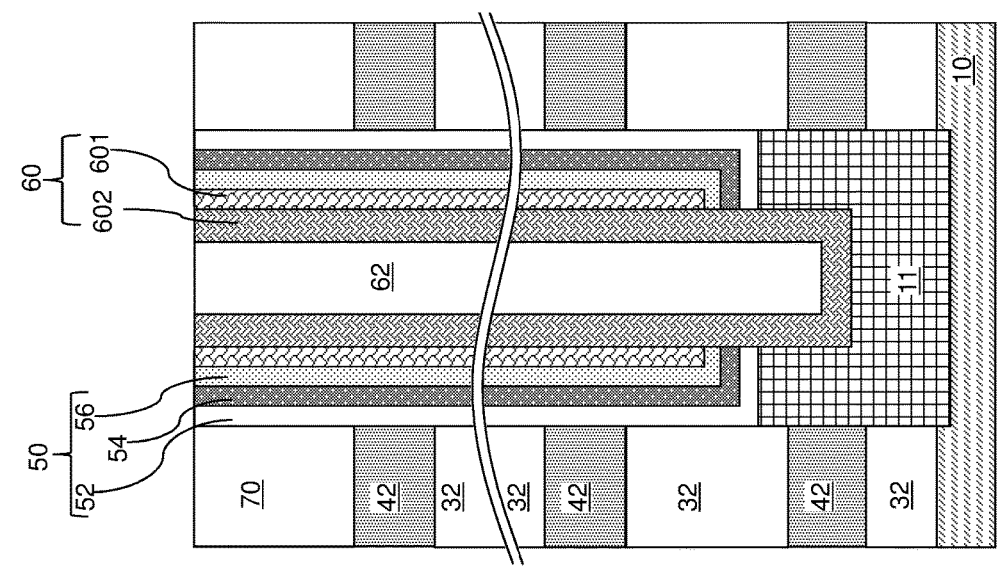

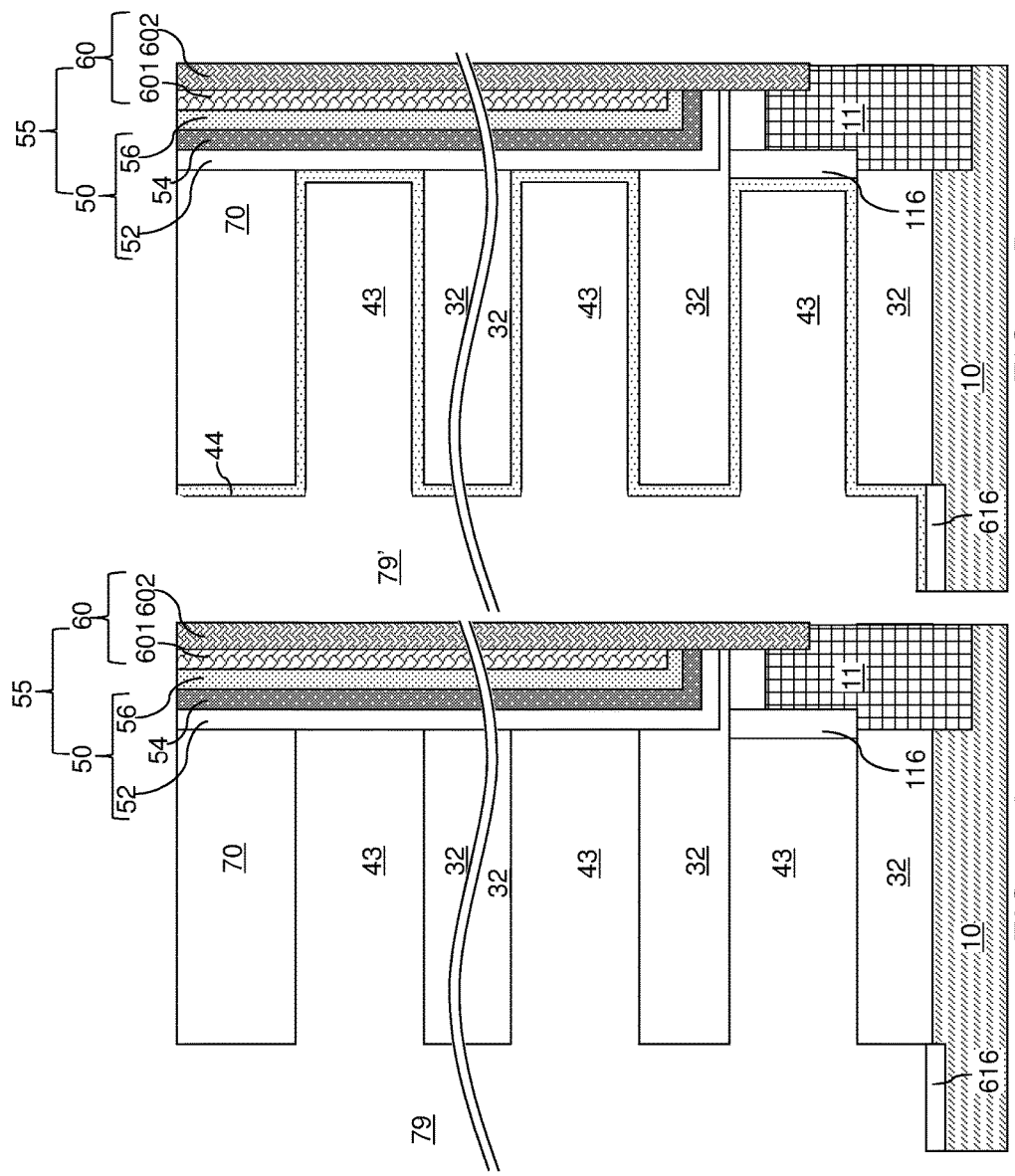

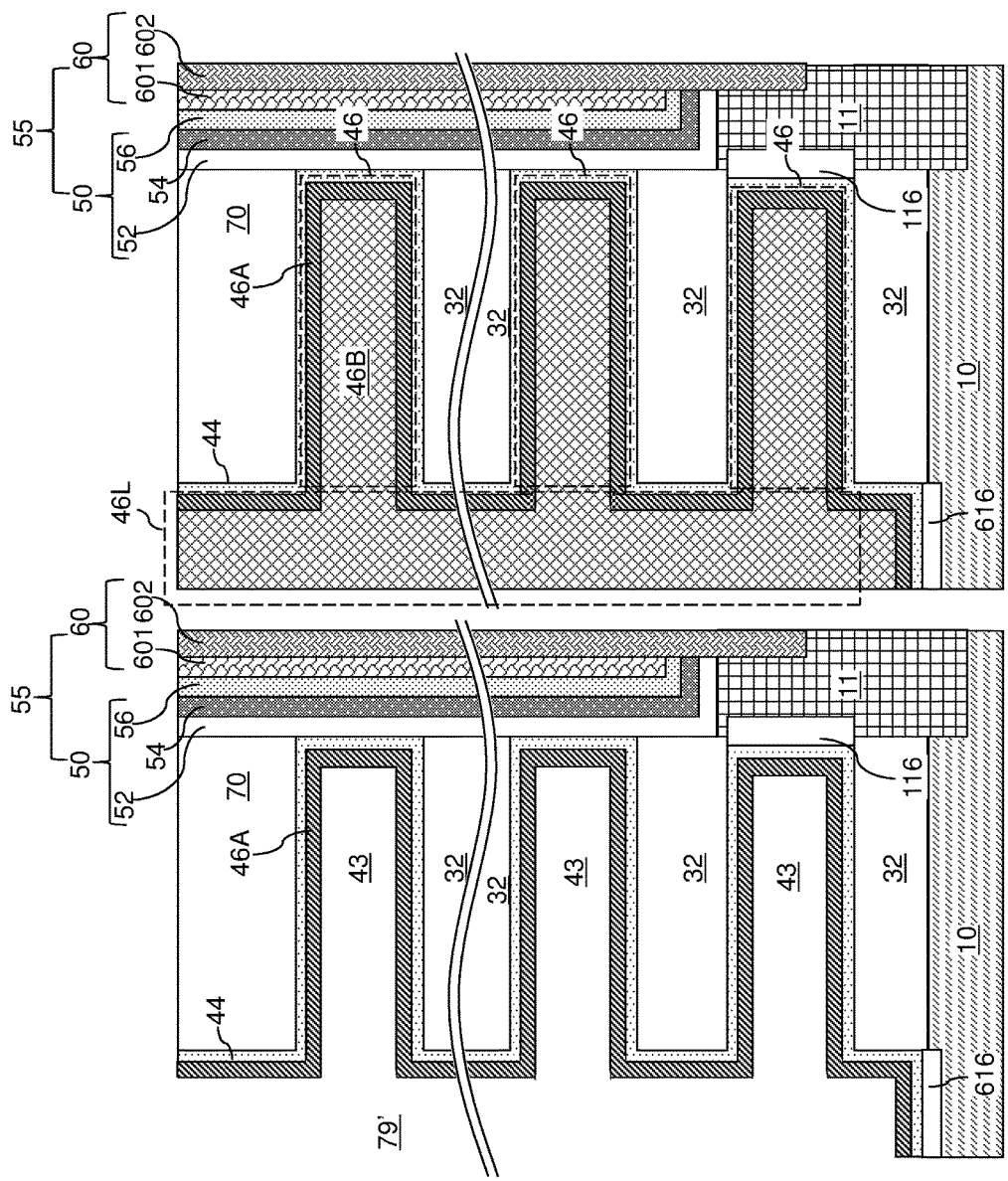

THREE-DIMENSIONAL MEMORY DEVICE WITH SELF-ALIGNED MULTI-LEVEL DRAIN SELECT GATE ELECTRODES

FIELD

The present disclosure relates generally to the field of semiconductor devices, and particular to a three-dimensional memory device employing self-aligned multi-level drain select level gate electrodes and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting an inner sidewall of the memory film. Two or more uppermost layers among the electrically conductive layers include first strip portions and second strip portions that are laterally spaced from one another by a drain select level isolation dielectric structure, which includes a pair of alternating sequences of non-concave sidewall portions and concave sidewall portions.

According to another aspect of the present disclosure, a three-dimensional memory device comprises an alternating stack of insulating layers and electrically conductive layers located over a substrate, memory stack structures extending through the alternating stack, wherein each of the memory stack structures comprises a memory film and a vertical semiconductor channel contacting an inner sidewall of the memory film, a first conductive connector spacer connected to each of first strip portions of two or more uppermost layers among the electrically conductive layers, and a second conductive connector spacer connected to each of second strip portions of the two or more uppermost layers among the electrically conductive layers. Each of the first and second conductive connector spacers includes an alternating sequence of conductive non-concave sidewall portions and conductive concave sidewall portions.

According to another aspect of the present disclosure, a method of forming a three-dimensional memory device is provided, which includes the steps of: forming an alternating stack of insulating layers and sacrificial material layers over a substrate; forming a drain select level isolation trench through two or more uppermost layers among the sacrificial material layers; forming sacrificial spacers on sidewalls of the drain select level isolation trench; forming memory stack structures extending through the alternating stack, wherein each of the memory stack structures comprises a memory film and a vertical semiconductor channel contacting an inner sidewall of the memory film; and replacing the sacrificial material layers and the sacrificial materials with conductive material portions. In one embodiment, electrically conductive layers are formed within volumes of the sacrificial material layers and conductive connector spacers are formed within volumes of the sacrificial spacers. Each of the conductive connector spacers provides electrical connection among two or more uppermost layers of the electrically conductive layers.

BRIEF DESCRIPTION OF THE DRAWINGS

FIGS. 13A-13H are sequential vertical cross-sectional views of a memory opening during formation of a memory stack structure according to an embodiment of the present disclosure.

FIGS. 17A-17D are sequential vertical cross-sectional views of a region of the exemplary structure between a backside trench and a memory opening between formation of the backside recesses and formation of electrically conductive layers according to an embodiment of the present disclosure.

DETAILED DESCRIPTION

Figure 1:
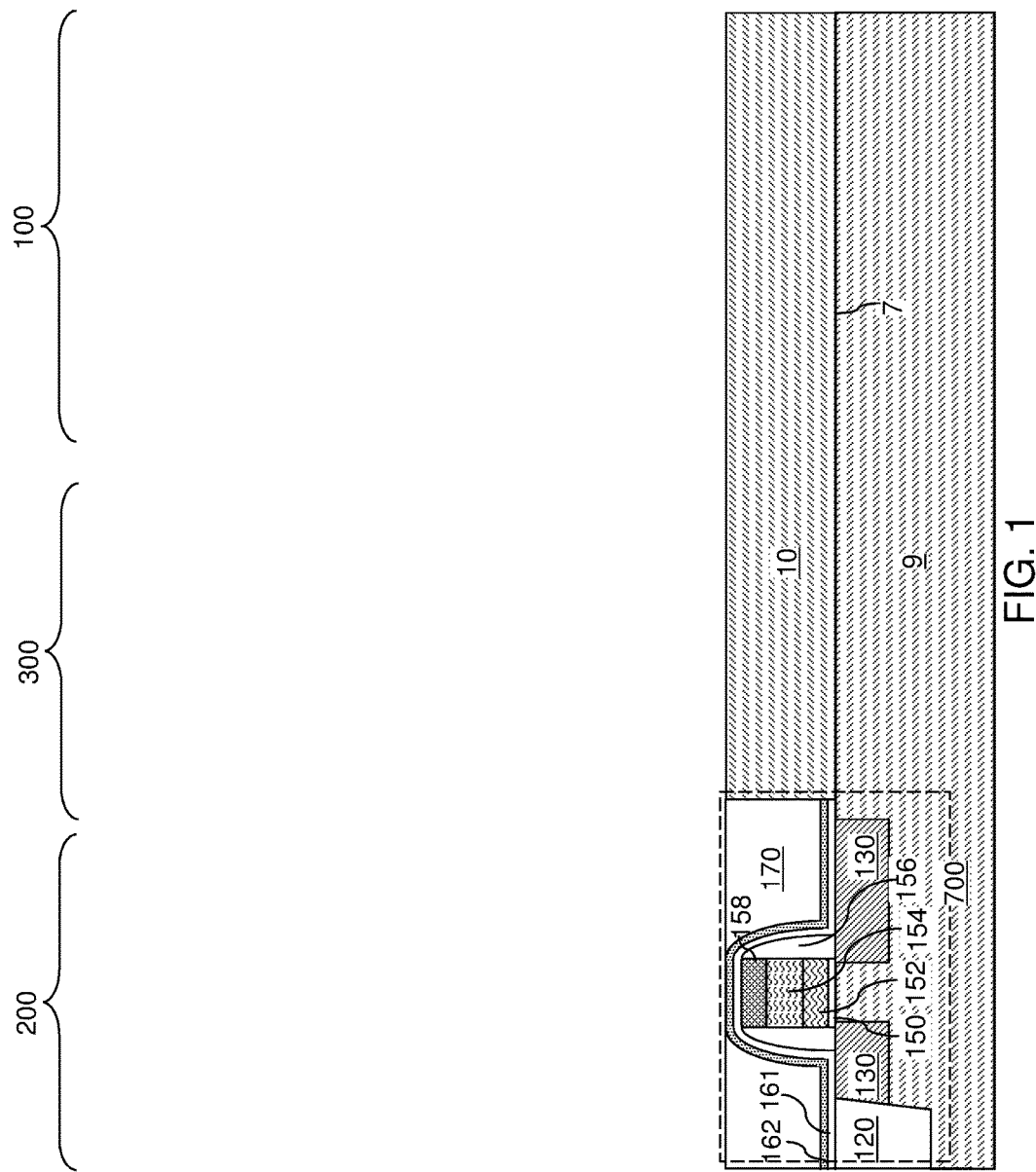
FIG. 1 is a vertical cross-sectional view of an exemplary structure after formation of at least one peripheral device and a semiconductor material layer according to an embodiment of the present disclosure.

As discussed above, the present disclosure is directed to a three-dimensional memory device employing self-aligned multi-level drain select level gate electrodes and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment, the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170. The semiconductor material layer 10 can be doped with electrical dopants of a first conductivity type, which can be p-type or n-type, The region (i.e., area) of the at least one semiconductor device 700 is herein referred to as a peripheral device region 200. The device region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
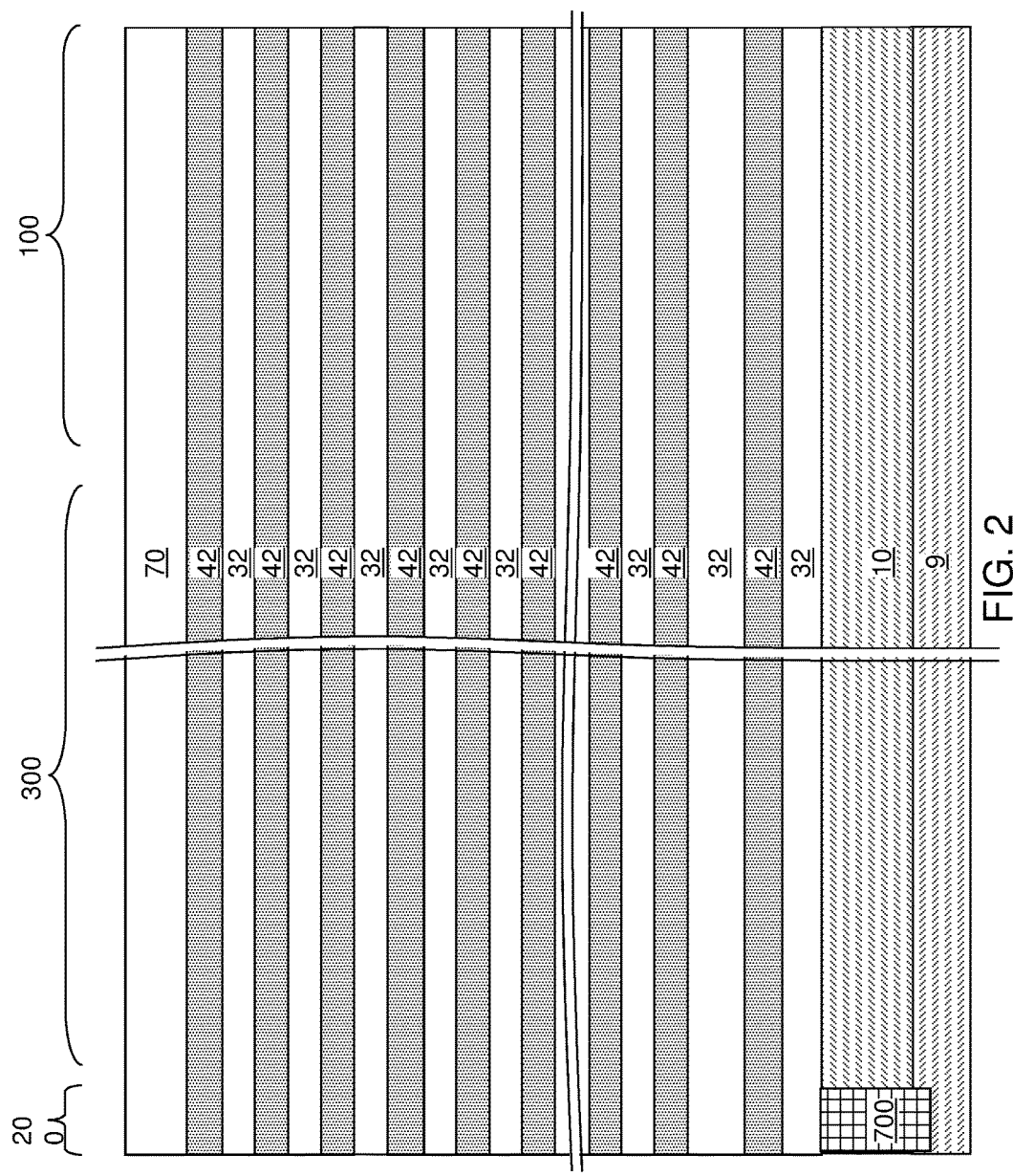
FIG. 2 is a vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
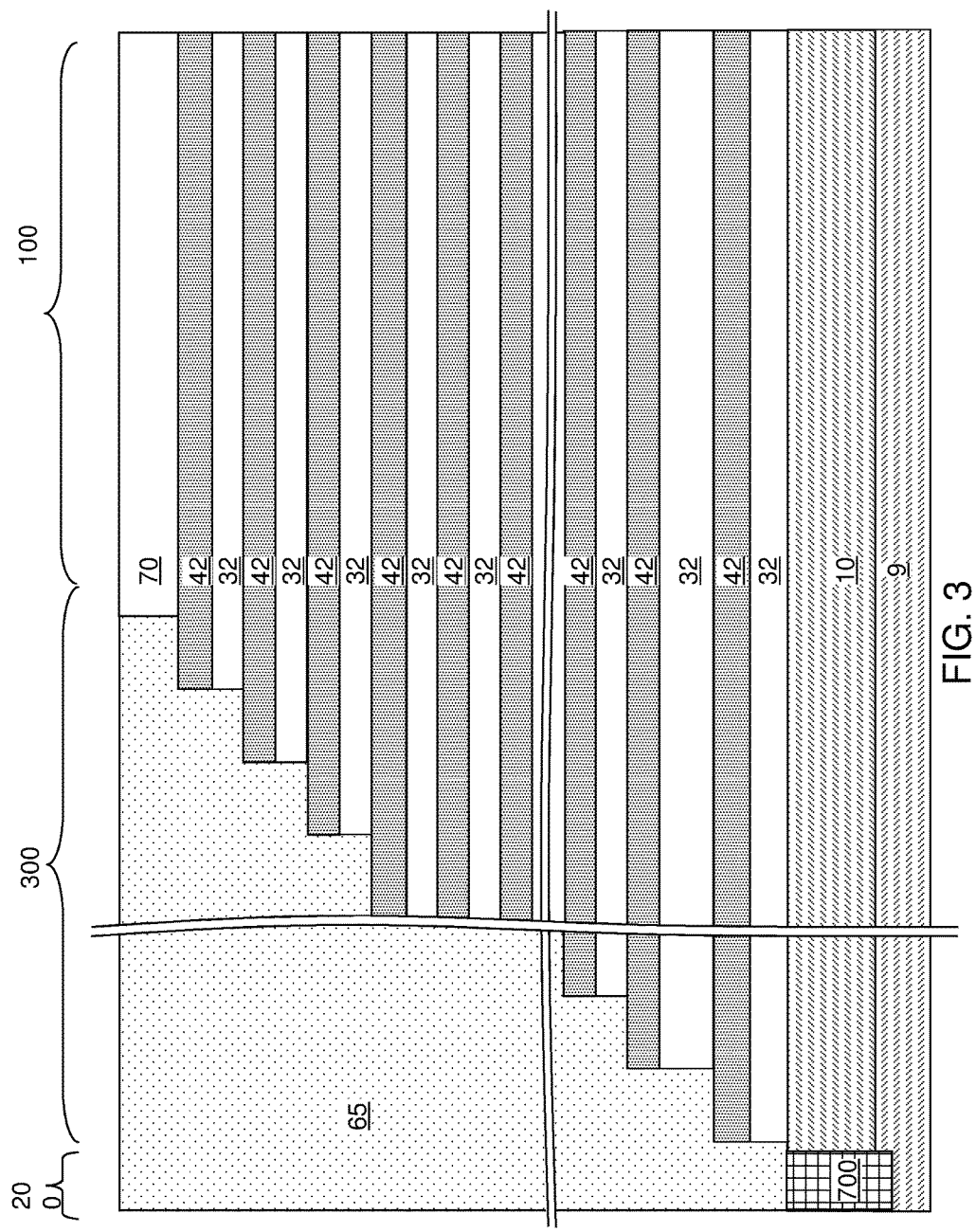
FIG. 3 is a vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
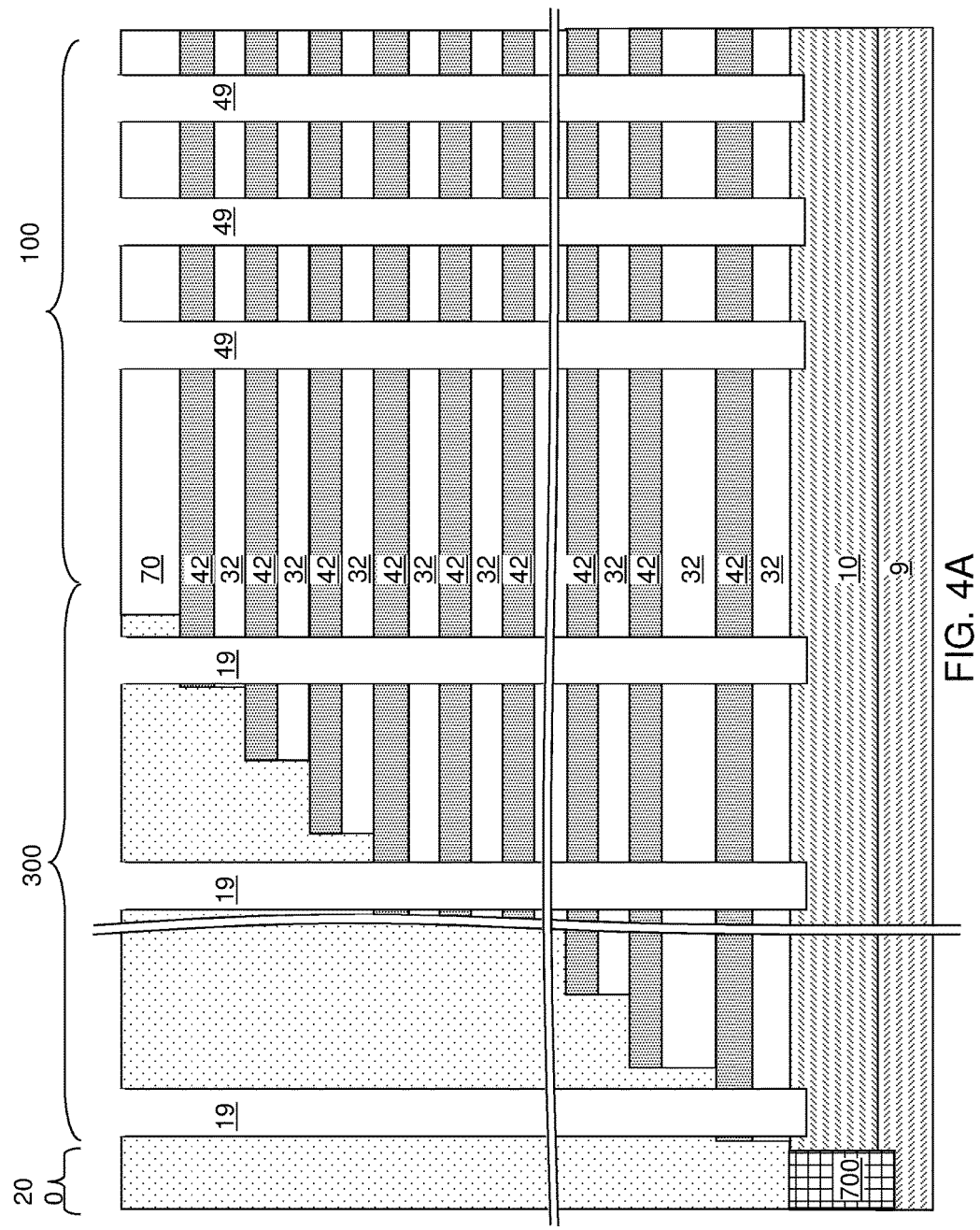
FIG. 4A is a vertical cross-sectional view of the exemplary structure after formation of memory openings and support openings according to an embodiment of the present disclosure.
Figure 4B:
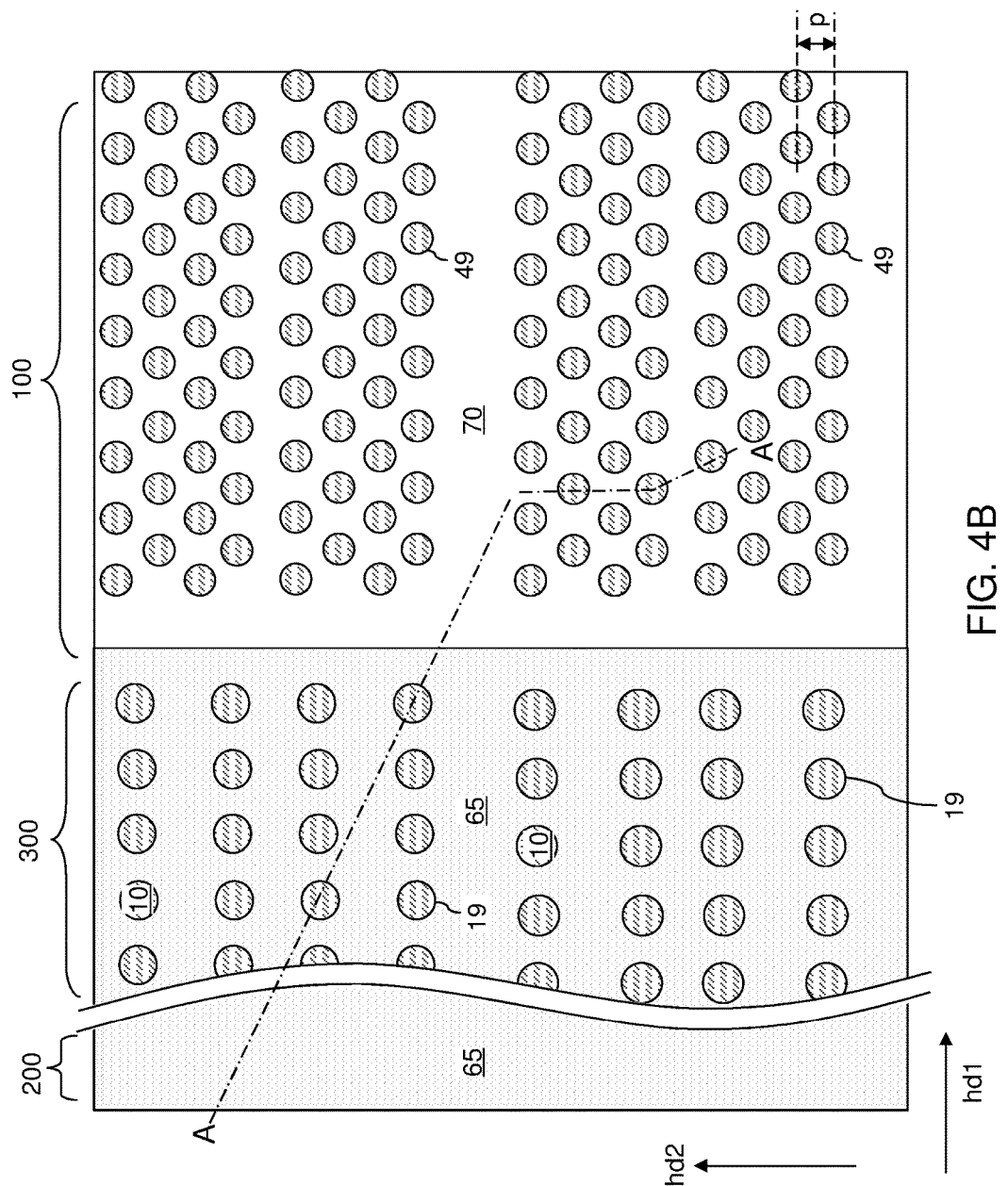
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the substrate (9, 10). In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

In one embodiment, the memory openings 49 can be formed as two-dimensional periodic arrays such that that each two-dimensional periodic array includes rows that extend along a first horizontal direction hd1 and having a uniform inter-row pitch p along a second horizontal direction hd2, which can be perpendicular to the first horizontal direction hd1. In one embodiment, a plurality of two-dimensional periodic arrays can be formed such that each two-dimensional periodic array is formed as a cluster that is laterally spaced from a neighboring two-dimensional periodic array along the second horizontal direction. Each two-dimensional periodic array can include respective rows that extend along the first horizontal direction hd1 and have a uniform inter-row pitch p along the second horizontal direction hd2.

Figure 5:
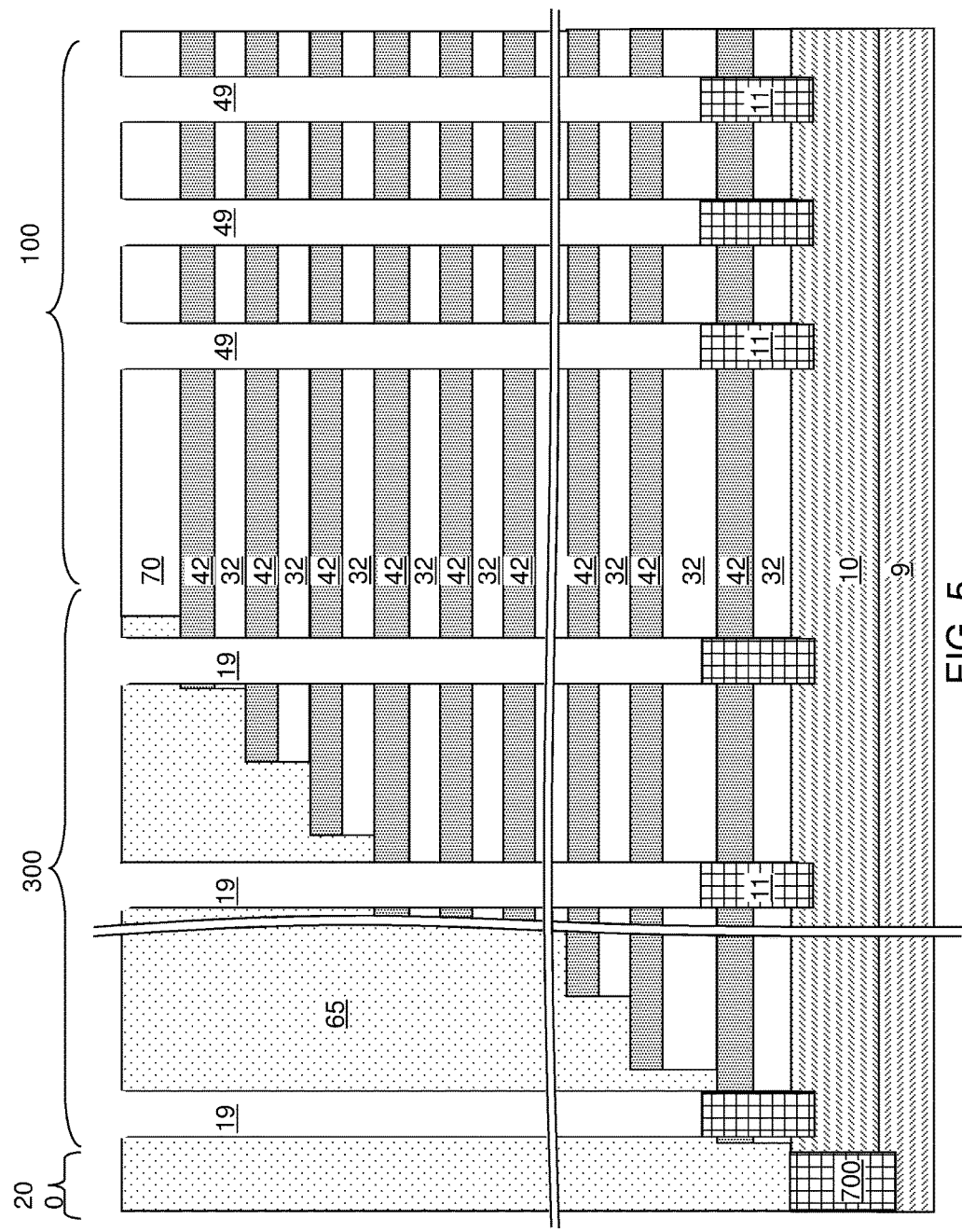
FIG. 5 is a vertical cross-sectional view of the exemplary structure after formation of pedestal channel portions according to an embodiment of the present disclosure.

Referring to FIG. 5, an optional pedestal channel portion 11 can be formed at the bottom portion of each memory opening 49 and each support openings 19, for example, by a selective semiconductor material deposition process. The selective semiconductor material deposition process grows a semiconductor material from physically exposed semiconductor surfaces and does not grow the semiconductor material from dielectric surfaces. The pedestal channel portions 11 can be single crystalline or polycrystalline. In case the semiconductor material layer 10 includes a single crystalline semiconductor material, each pedestal channel portion 11 can comprise a single crystalline semiconductor material in epitaxial alignment with the single crystalline semiconductor material of the semiconductor material layer 10.

In one embodiment, the top surface of each pedestal channel portion 11 can be formed above a horizontal plane including the top surface of a bottommost sacrificial material layer 42. In this case, at least one source select gate electrode can be subsequently formed by replacing the bottommost sacrificial material layer 42 located below the horizontal plane including the top surfaces of the pedestal channel portions 11 with a respective conductive material layer. Each pedestal channel portion 11 can be a portion of a transistor channel that extends between a source region to be subsequently formed in the substrate (9, 10) and a drain region to be subsequently formed in an upper portion of the memory opening 49. A cavity is present in the unfilled portion of the memory opening 49 above each pedestal channel portion 11. In one embodiment, each pedestal channel portion 11 can comprise single crystalline silicon. In one embodiment, each pedestal channel portion 11 can have a doping of the first conductivity type, which is the same as the conductivity type of the semiconductor material layer 10 that the pedestal channel portion contacts. If a semiconductor material layer 10 is not present, each pedestal channel portion 11 can be formed directly on the substrate semiconductor layer 9, which can have a doping of the first conductivity type.

Figure 6:
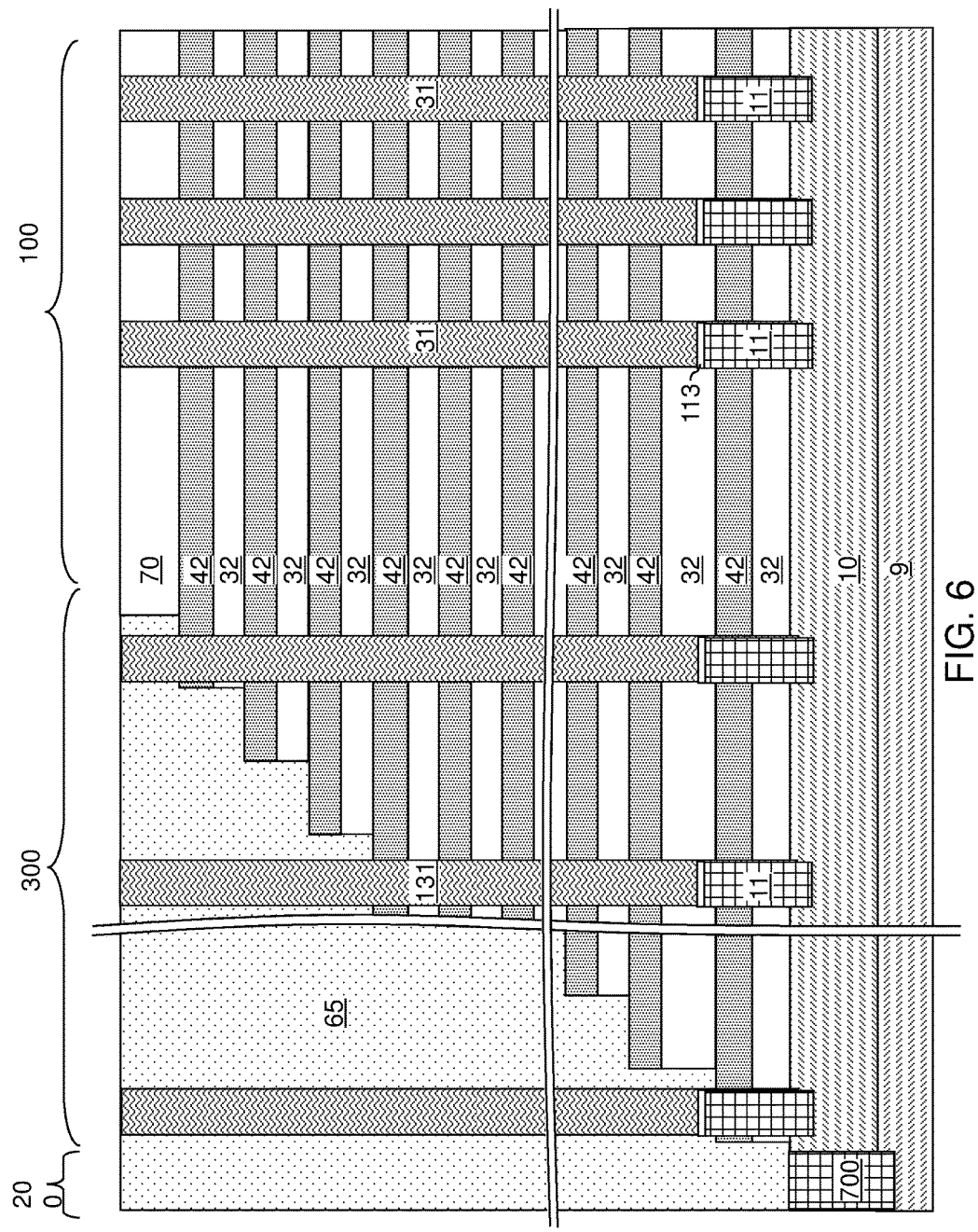
FIG. 6 is a vertical cross-sectional view of the exemplary structure after formation of sacrificial semiconductor oxide plates, sacrificial memory opening fill structures, and sacrificial support opening fill structures according to an embodiment of the present disclosure.

Referring to FIG. 6, sacrificial semiconductor oxide plates 113 can be formed by oxidizing surface portions of the pedestal channel portions 11. Sacrificial memory opening fill structures 31 and sacrificial support opening fill structures 131 can be formed by depositing a sacrificial material in remaining volumes of the memory openings 49 and the support openings 19, respectively. Excess portions of the sacrificial material can be removed from above the horizontal plane including the top surface of the insulating cap layer 70. The sacrificial memory opening fill structures 31 and sacrificial support opening fill structures 131 include a sacrificial material that can be removed selective to the material of the insulating layers 32, the sacrificial material layers 42, the insulating cap layer 70, and the retro-stepped dielectric material portion 65. In a non-limiting illustrative example, the insulating layers 32, the insulating cap layer 70, and the retro-stepped dielectric material portion 65 can include silicon oxide, the sacrificial material layers 42 can include silicon nitride, and the sacrificial memory opening fill structures 31 and sacrificial support opening fill structures 131 can include amorphous silicon, polysilicon, a silicon-germanium alloy, amorphous carbon, diamond-like carbon (DLC), or a silicon-containing polymer.

Figure 7A:
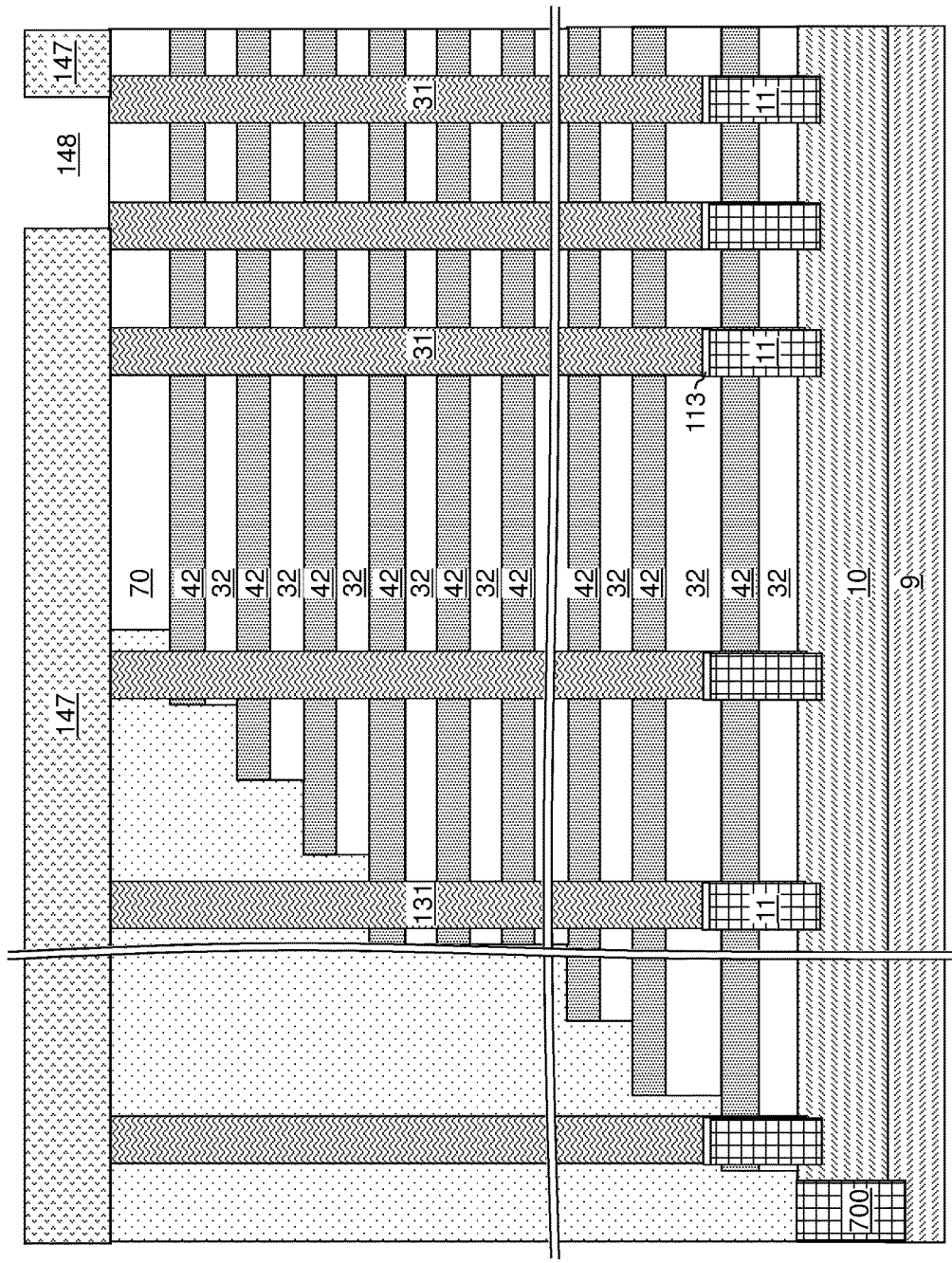
FIG. 7A is a vertical cross-sectional view of the exemplary structure after application and patterning of a photoresist layer according to an embodiment of the present disclosure.
Figure 7B:
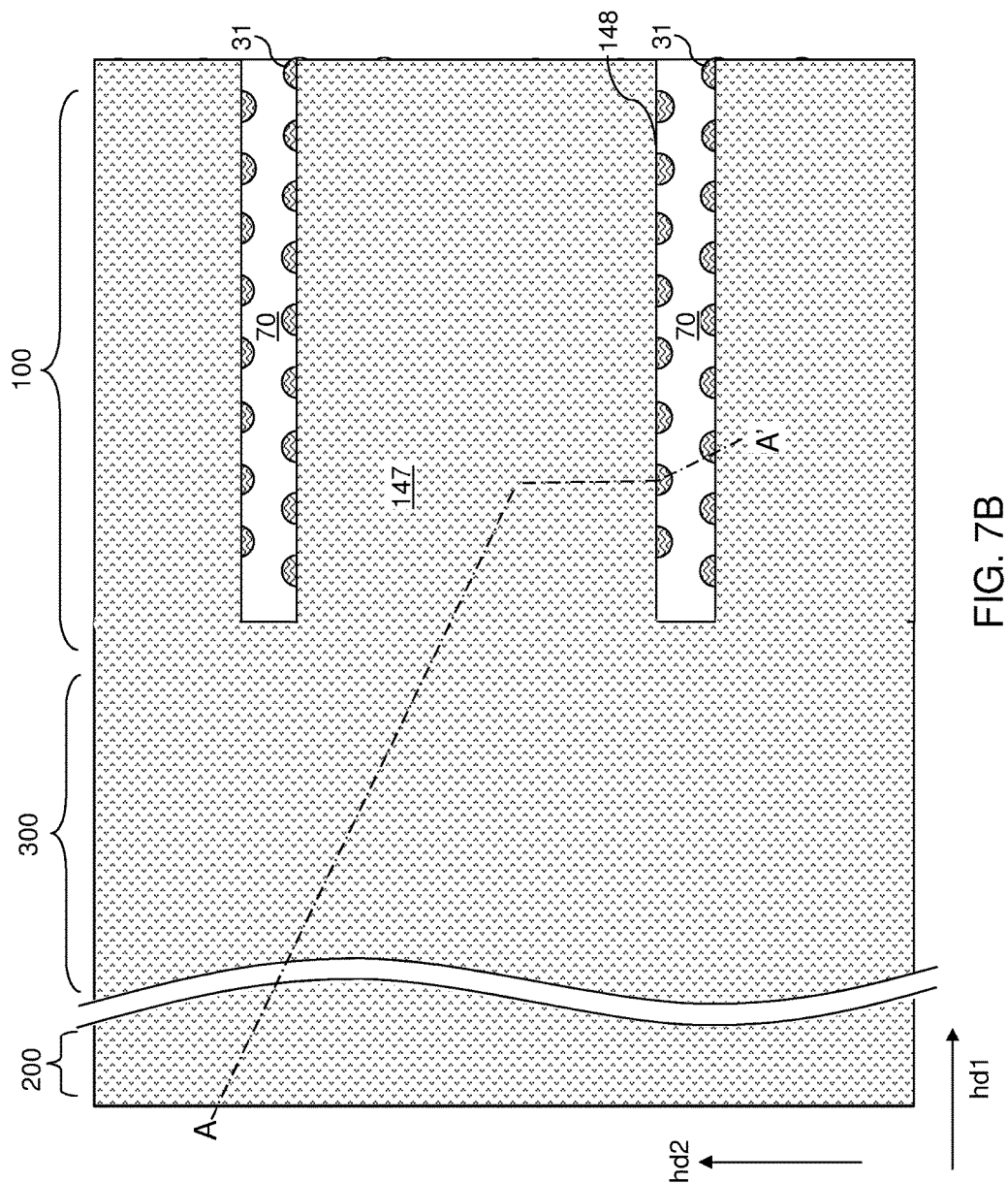
FIG. 7B is a top-down view of the exemplary structure of FIG. 7A. The vertical plane A-A' is the plane of the cross-section for FIG. 7A.

Referring to FIGS. 7A and 7B, a photoresist layer 147 can be applied over the insulating cap layer 70 and the retro-stepped dielectric material portion 65, and can be lithographically patterned to form openings, such as linear openings 148 therethrough. As used herein, a "linear opening" refers to an opening having a line shape that is defined by a pair of lengthwise edges that are parallel to each other. Thus, each linear opening 148 can have a uniform width that is invariant along the lengthwise direction of the liner opening. In one embodiment, the linear openings 148 through the photoresist layer 147 can include rectangular openings. Lengthwise sidewalls of the photoresist layer 147 around each linear opening overlie a respective row of sacrificial memory opening fill structures 31, which is one of the two neighboring rows of the memory openings fill structures 31 that are partially exposed underneath the linear opening in the photoresist layer 147. In one embodiment, the linear openings 148 do not extend into the contact region 300 or the peripheral device region 200.

The shapes of the linear openings through the photoresist layer 147 can be selected such that a linear opening or a backside trench to be subsequently formed is disposed between neighboring sub-blocks of memory openings. As used herein, a "sub-block" refers to a smallest unit group of memory stack structures that is activated by a common drain select gate electrode or a smallest unit group of memory openings in which a respective smallest unit group of memory stack structures that is activated by a common drain select gate electrode is subsequently formed. As used herein, a "block" refers to a group of memory stack structures located between a neighboring pair of backside trenches (to be subsequently formed) or a group of memory openings in which a group of memory stack structures located between a neighboring pair of backside trenches is to be subsequently formed. All memory stack structures located in the same block can be surrounded by the same word line in a given device level (e.g., the same set of vertically spaced word lines can surround each memory stack structure in a given block).

In one embodiment, the shapes of the linear openings 148 through the photoresist layer 147 can be selected such that each lengthwise edge of a linear opening extends over a respective row of sacrificial memory opening fill structures within a pair of neighboring rows of sacrificial memory opening fill structures 31. For example, a neighboring pair of rows of sacrificial memory opening fill structures 31 can include a first row of sacrificial memory opening fill structures 31 arranged along the first horizontal direction hd1 and a second row of sacrificial memory opening fill structures 31 arranged along the first horizontal direction hd1 and laterally spaced apart along the second horizontal direction hd2. In one embodiment, the locations of the sacrificial memory opening fill structures 31 can be laterally offset along the first horizontal direction hd1 by one half of the pitch of the sacrificial memory opening fill structures 31 along the first horizontal direction hd1 between the first row and the second row. Thus, a first vertical sidewall of the photoresist layer 147 can contact, and laterally extend over, the first row of sacrificial memory opening fill structures 31, and a second vertical sidewall of the photoresist layer 147 can contact, and laterally extend over, the second row of sacrificial memory opening fill structures 31. The percentage of physically exposed top surface portions of each sacrificial memory opening fill structure 31 relative to the total area of the top surface of the respective sacrificial memory opening fill structure 31 can be in a range from 20% to 80%, such as from 40% to 60%.

Figure 8A:
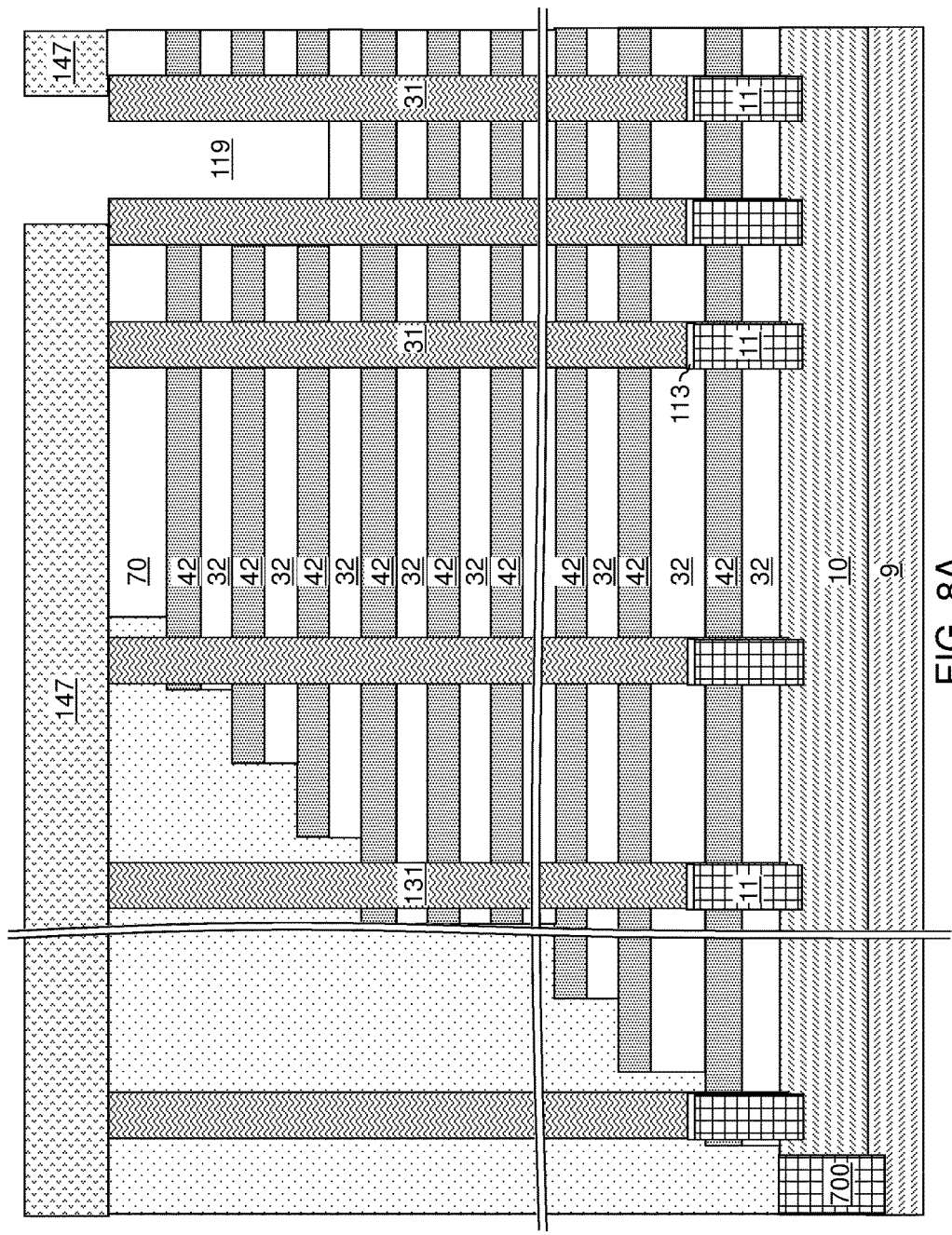
FIG. 8A is a vertical cross-sectional view of the exemplary structure after formation of drain select level isolation trenches according to an embodiment of the present disclosure.
Figure 8B:
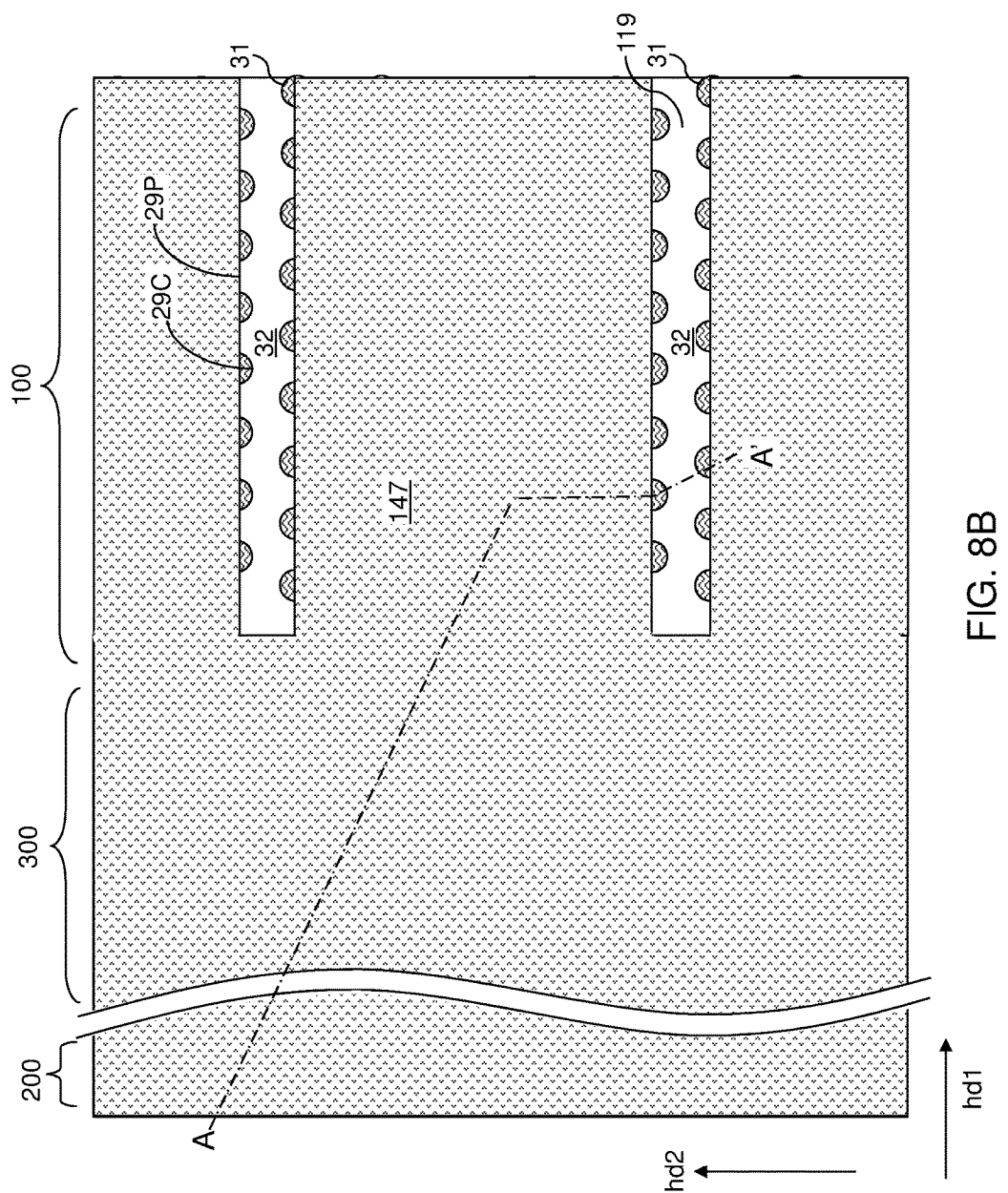
FIG. 8B is a top-down view of the exemplary structure of FIG. 8A. The vertical plane A-A' is the plane of the cross-section for FIG. 8A.

Referring to FIGS. 8A and 8B, an anisotropic etch process that etches the materials of the insulating cap layer 70, the insulating layers 32, and the sacrificial material layers 42 selective to the material of the sacrificial memory opening fill structures 31 can be performed to form drain select level isolation trenches 119. The photoresist layer 147 and the sacrificial memory opening fill structures 31 are collectively employed as an etch mask for forming the drain select level isolation trenches 119. The areas of the drain select level isolation trenches 119 correspond to the intersection of the areas of the linear openings 148 in the photoresist layer 147 and the complement of the areas of the sacrificial memory opening fill structures 31. The drain select level isolation trenches 119 are formed through each level at which drain select gate electrodes are to be subsequently formed. As used herein, a drain select gate electrode refers to an electrode that activates a subset of memory stack structures by applying an electrical bias voltage to a region of a semiconductor channel that is proximal to a drain of a vertical field effect transistor. The drain select level isolation trenches 119 are formed through the insulating cap layer 70, through two or more uppermost layers among the sacrificial material layers 42, and through any one or more intervening insulating layers 32, but preferably does not significantly etch the sacrificial memory opening fill structures 31.

In one embodiment, each drain select level isolation trench 119 can vertically extend through two topmost sacrificial material layers 42 and an insulating layer 32 therebetween. In another embodiment, each drain select level isolation trench 119 can vertically extend through three topmost sacrificial material layers 42 and two insulating layers 32 thereamongst. In another embodiment, each drain select level isolation trench 119 can vertically extend through four topmost sacrificial material layers 42 and three insulating layers thereamongst. The levels of the sacrificial material layers 42 through which the drain select level isolation trenches 119 vertically extend are herein referred to as drain select levels.

Each drain select level isolation trench 119 is formed with a pair of lengthwise sidewalls that generally extend along the first horizontal direction hd1, as shown in FIG. 8B. Each of the pair of lengthwise sidewalls of a drain select level isolation trench 119 can includes a pair of alternating sequences of non-convex sidewall portions 29P and convex sidewall portions 29C. Each non-convex sidewall portion 29P can be planar portion if the adjacent memory openings 49 containing the sacrificial memory opening fill structures 31 are spaced sufficiently far apart to provide a planar portion, or each portion 29P can be a concave portion if the adjacent memory openings are spaced too close to each other to leave room for a planar portion. Each of the convex sidewall portions can include a sidewall of a respective one of the sacrificial memory opening fill structures 31. Specifically, each convex sidewall portion 29C can be a physically exposed sidewall of a sacrificial memory opening fill structure 31, and each non-convex (e.g., planar or concave) sidewall 29P can include vertically coincident sidewalls of insulating layers 32 and sacrificial material layers 42 located at levels of the drain select gate electrodes to be subsequently formed. The photoresist layer 147 can be subsequently removed, for example, by ashing.

Figure 9:
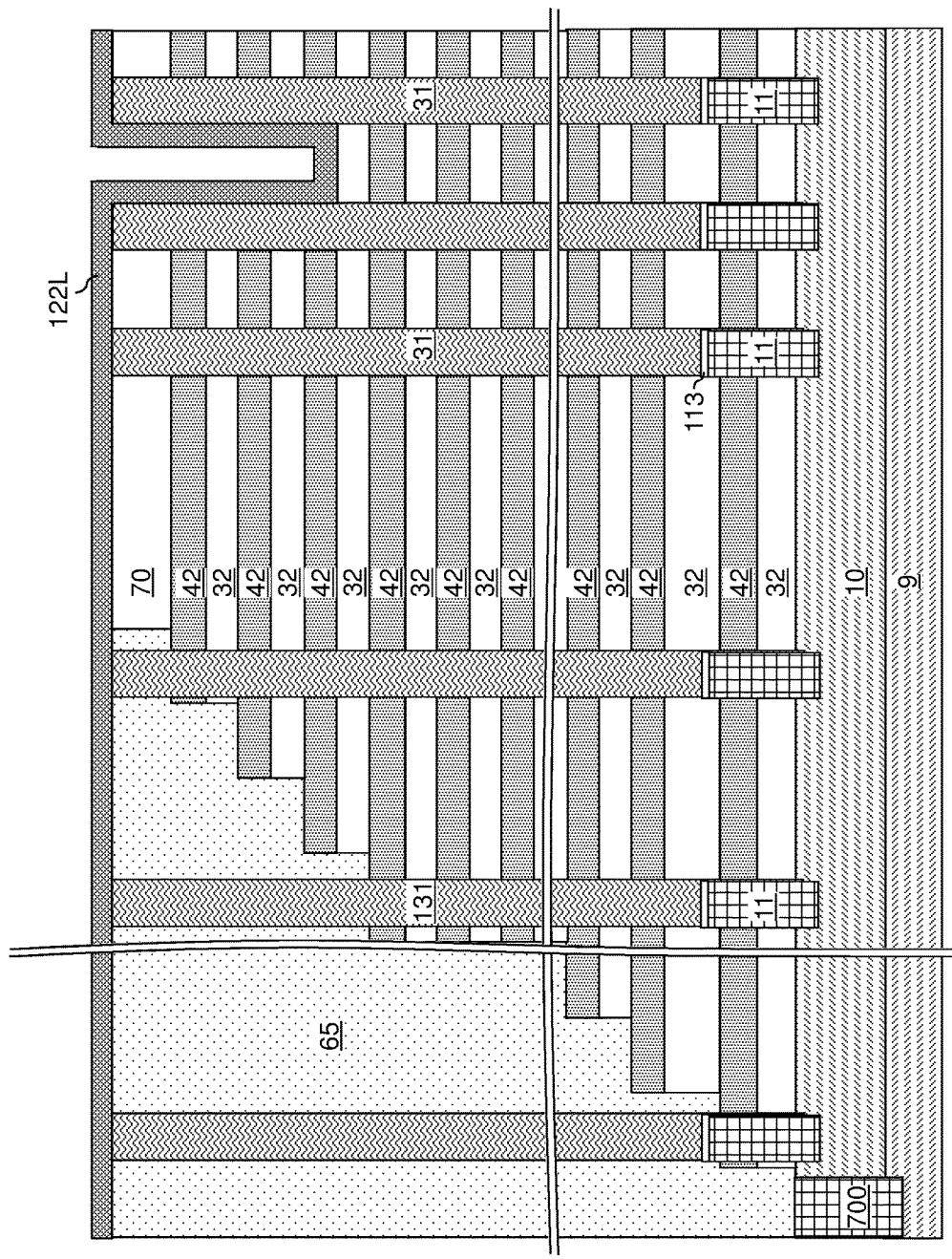
FIG. 9 is a vertical cross-sectional view of the exemplary structure after formation of a sacrificial spacer material layer according to an embodiment of the present disclosure.

Referring to FIG. 9, a sacrificial spacer material layer 122L can be deposited on the physically exposed surfaces of the drain select level isolation trench 119 and the top surfaces of the insulating cap layer 70 and the retro-stepped dielectric material portions 65. The sacrificial spacer material layer 122L includes a material that is different from the materials of the insulating layers 32, the insulating cap layer 70, the retro-stepped dielectric material portion 65, and the sacrificial memory opening fill structures 31. The material of the sacrificial spacer material layer 122L may be the same as, or may be different from, the material of the sacrificial material layers 42. In one embodiment, the sacrificial spacer material layer 122L and the sacrificial material layers 42 can include silicon nitride materials. The sacrificial spacer material layer 122L can be deposited by a conformal deposition method such as low pressure chemical vapor deposition or atomic layer deposition. The thickness of the sacrificial spacer material layer 122L can be less than one half of the narrowest portions between a pair of lengthwise sidewalls of each drain select level isolation trench 119. Thus, a continuous cavity laterally extends generally along the first horizontal direction hd1 within each drain select level isolation trench 119.

Figure 10A:
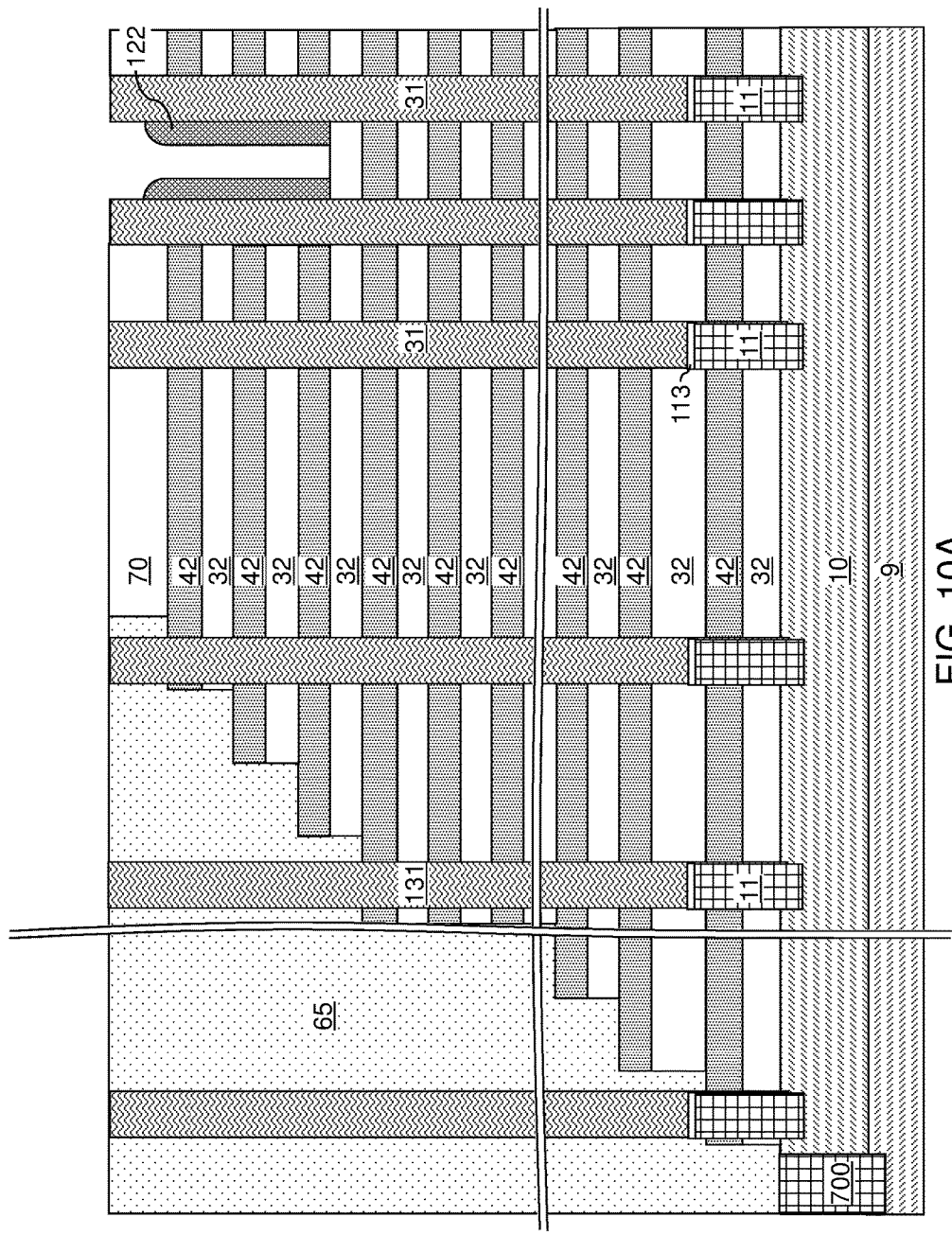
FIG. 10A is a vertical cross-sectional view of the exemplary structure after formation of sacrificial spacers according to an embodiment of the present disclosure.
Figure 10B:
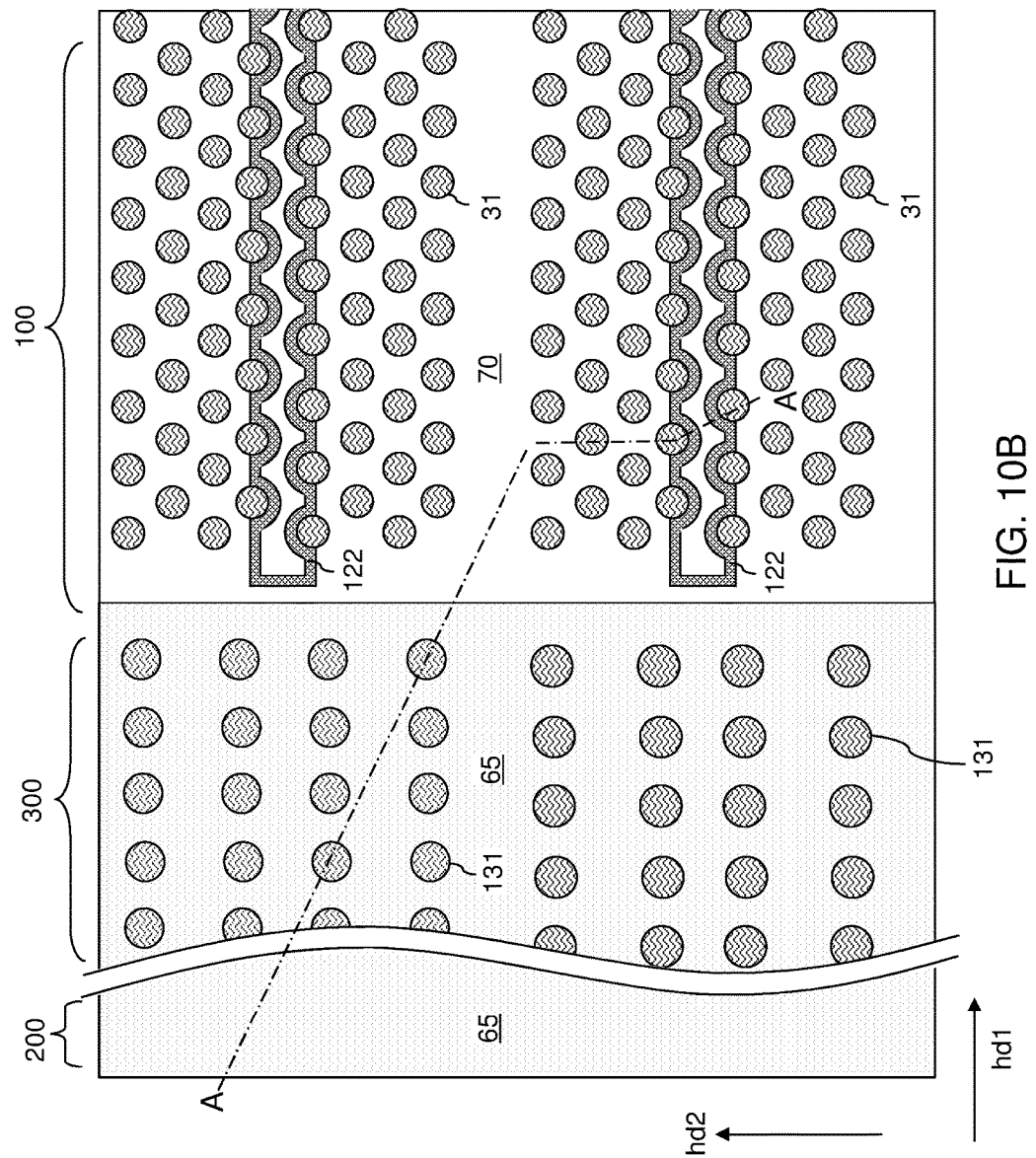
FIG. 10B is a top-down view of the exemplary structure of FIG. 10A. The vertical plane A-A' is the plane of the cross-section for FIG. 10A.

Referring to FIGS. 10A and 10B, an anisotropic etch process is performed to remove horizontal portions of the sacrificial spacer material layer 122L. Remaining vertical portions of the sacrificial spacer material layer 122L in the drain select level isolation trenches 119 constitute sacrificial spacers 122.

Figure 11:
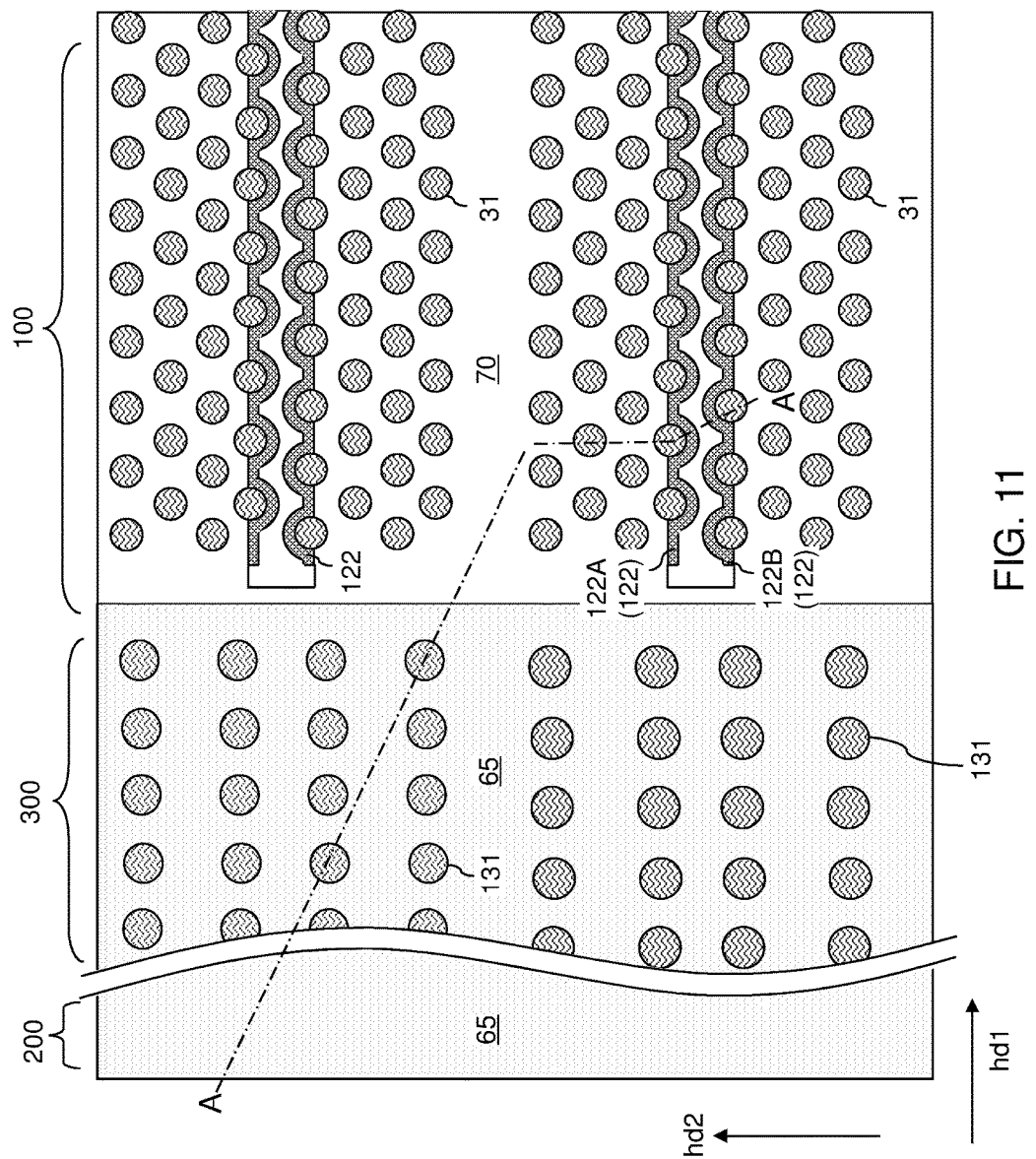
FIG. 11 is a top-down view of the exemplary structure after dividing the sacrificial spacers by removing lengthwise-end portions of the sacrificial spacers according to an embodiment of the present disclosure.

Referring to FIG. 11, a photoresist layer (not shown) can be applied over the exemplary structure. Openings can be formed through the photoresist layer by lithographic exposure and development. The openings in the photoresist layer can be formed in regions located at lengthwise ends of the drain select level isolation trenches 119. An etch process that removes the material of the sacrificial spacers 122 can be performed to remove physically exposed portions of the sacrificial spacers 122. Each sacrificial spacer 122 can be divided into two physically disjoined sacrificial spacers 122.

Each sacrificial spacer 122 can be formed on convex sidewalls of the sacrificial memory opening fill structures 31 and non-convex (e.g., planar or concave) sidewalls of the two or more uppermost layers among the sacrificial material layers 42 through which the drain select level isolation trenches 119 vertically extend, i.e., the planar or concave sidewalls of the sacrificial material layers 42 that are located at drain select levels. Each sacrificial material layer 42 through which the drain select level isolation trenches 119 vertically extend includes strip portions that laterally extend along the first horizontal direction hd1 between a neighboring pair of drain select level isolation trenches 119. Within each drain select level isolation trench 119, a first sacrificial spacer 122A can contact sidewalls of a first strip portion of each of two or more uppermost layers among the sacrificial material layers 42 located at the drain select levels, and a second sacrificial spacer 122B can contact sidewalls of a second strip portion of each of the two or more uppermost layers among the sacrificial material layers 42 located at the drain select levels. Each of the first and second sacrificial spacers (122A, 122B) includes an outer sidewall that includes an alternating sequence of non-concave (e.g., planar or convex) sidewall portions and concave sidewall portions. The non-concave sidewall portions contact the sidewalls of a subset of layers within the alternating stack (32, 42). The sacrificial spacers (122A, 122B) also have an inner sidewall that includes an alternating sequence of non-convex (e.g., planar or concave) sidewall portions and convex sidewall portions that are physically exposed. Each of the inner concave sidewall portions of the sacrificial spacers 122 can be contact a respective one of the sacrificial memory opening fill structures 31, and each of the outer convex sidewall portions of the sacrificial spacers 122 can be equidistant from a respective one of the sacrificial memory opening fill structures 31. A cavity is present within an unfilled volume of each drain select level isolation trench 119 after formation of the sacrificial spacers 122 therein.

Figure 12A:
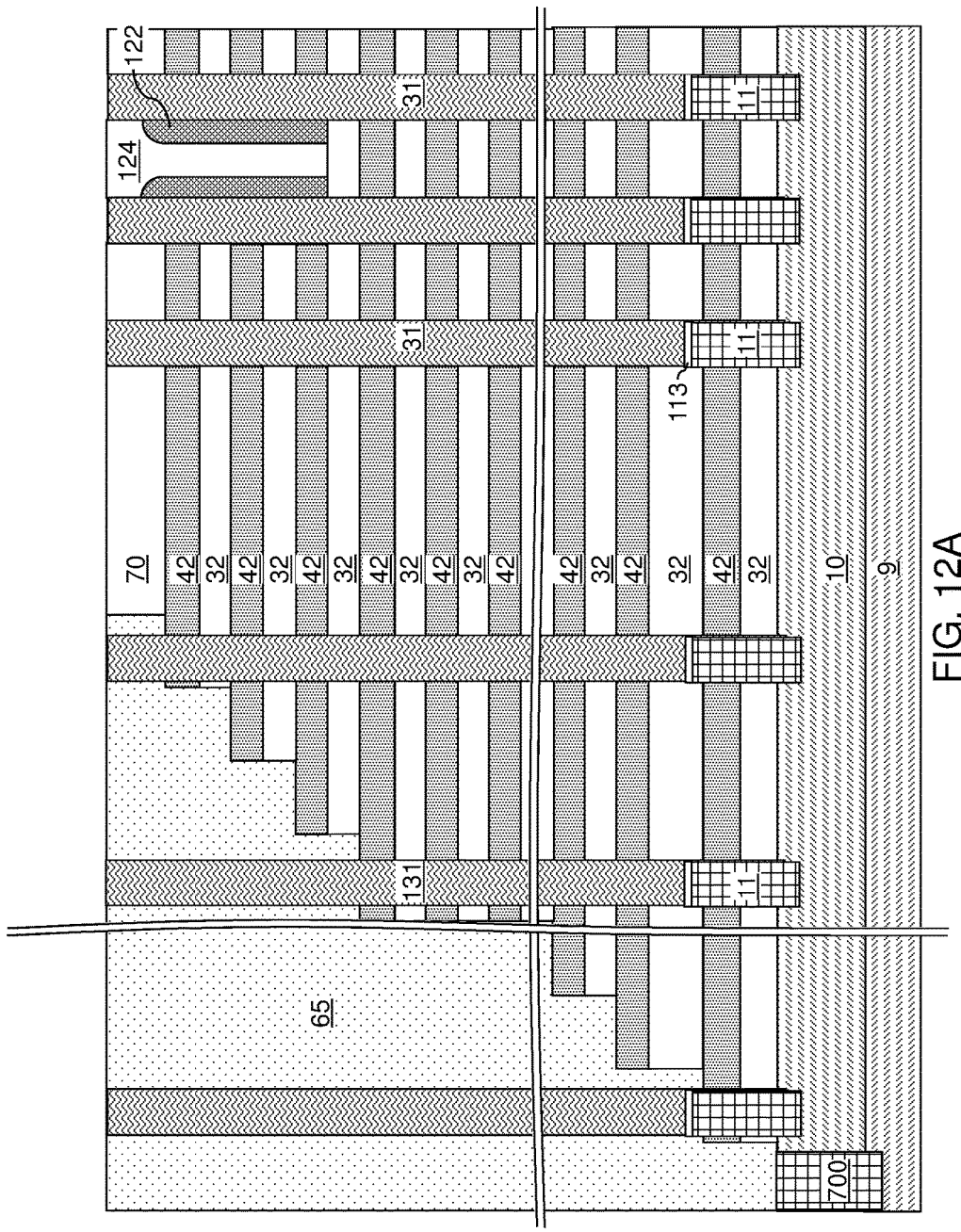
FIG. 12A is a vertical cross-sectional view of the exemplary structure after formation of drain select level isolation dielectric structures according to an embodiment of the present disclosure.
Figure 12B:
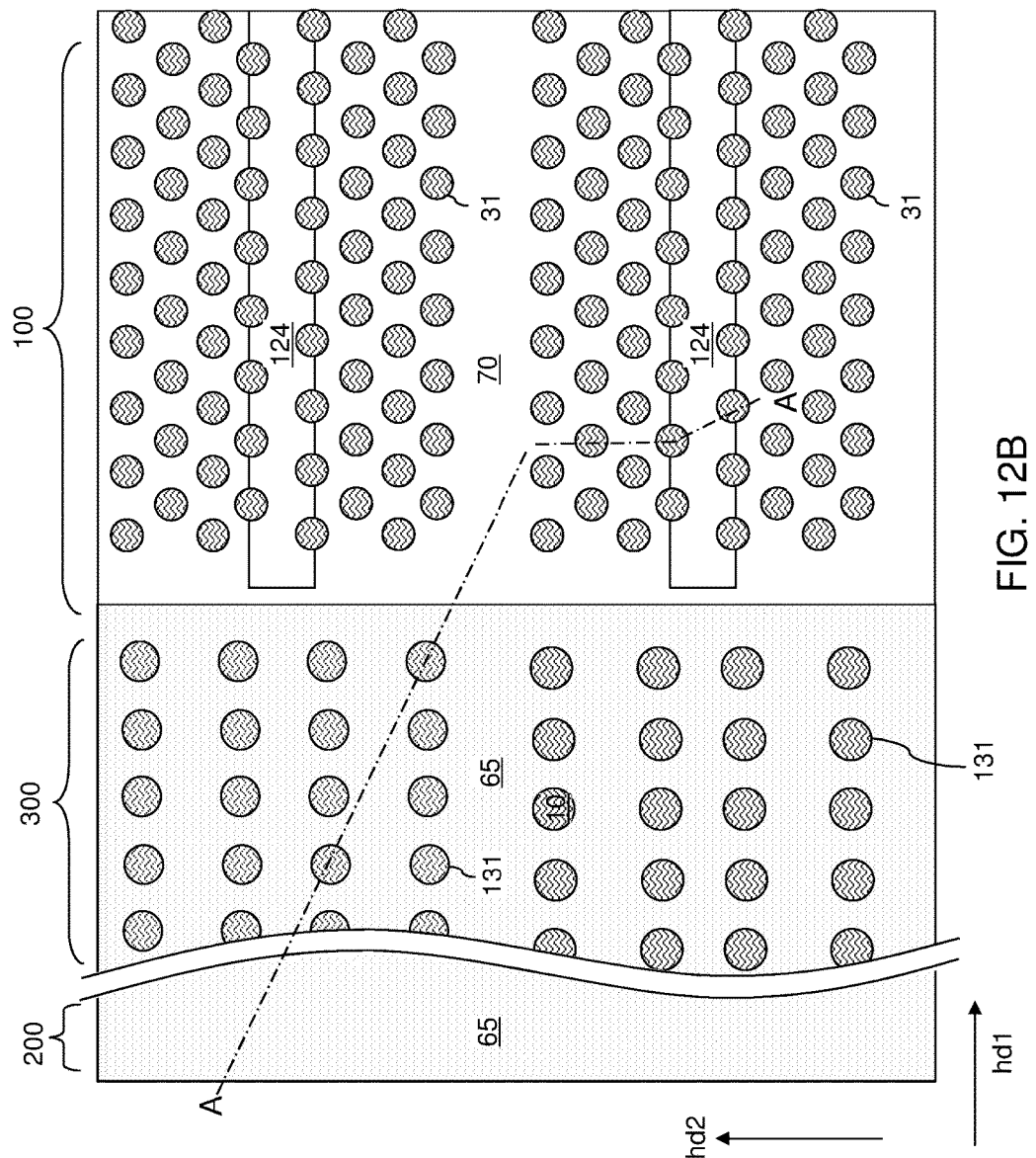
FIG. 12B is a top-down view of the exemplary structure of FIG. 12A. The vertical plane A-A' is the plane of the cross-section for FIG. 12A.

Referring to FIGS. 12A and 12B, a dielectric material is deposited within the cavities in the drain select level isolation trenches 119. The dielectric material includes a material that is different from the materials of the sacrificial spacers 122 and the sacrificial memory opening fill structures 31. For example, the dielectric material can include silicon oxide. Excess portions of the dielectric material can be removed from above the horizontal plane including the top surfaces of the insulating cap layer 70 and the retro-stepped dielectric material portion 65 by a planarization process, which can include chemical mechanical planarization (CMP) and/or a recess etch. Each remaining portion of the dielectric material in the drain select level isolation trenches 119 constitute dielectric structures, which are herein referred to as drain select level isolation dielectric structures 124. The drain select level isolation dielectric structures 124 laterally extend along the first horizontal direction hd1.

Each sacrificial material layer 42 located at drain select levels includes strip portions that laterally extend along the first horizontal direction hd1 and are laterally spaced from one another by drain select level isolation dielectric structures 124. Each drain select level isolation dielectric structure 124 includes a pair of alternating sequences of non-concave (e.g., planar or convex) sidewall portions and concave sidewall portions. The non-concave sidewall portions can be planar if the memory openings 49 are spaced far enough apart or they can be convex if the memory openings 49 are not spaced far enough apart to form planar portions. Each of the concave sidewall portions is equidistant from an outer sidewall of a respective one of the sacrificial memory opening fill structures 31. The distance between each concave sidewall portion and the respective one of the sacrificial memory opening fill structures 31 can be the lateral thickness of a sacrificial spacer 122. In one embodiment, each pair of alternating sequences of non-concave sidewall portions and concave sidewall portions can include a first alternating sequence of first planar sidewall portions and first concave sidewall portions contacting a first sacrificial spacer within a pair of sacrificial spacers 122 in a drain select level isolation trench 119, and a second alternating sequence of second planar sidewall portions and second concave sidewall portions contacting a second sacrificial spacer within the pair of sacrificial spacers 122. In one embodiment, the first planar sidewall portions can be located within a first vertical plane, and the second planar sidewall portions can be located within a second vertical plane that is parallel to the first vertical plane.

FIGS. 13A-13H illustrate structural changes in a memory opening 49, which is one of the memory openings 49 in the exemplary structure of FIGS. 12A and 12B, during replacement of a memory opening fill structure 31 with a memory stack structure. The same structural change occurs simultaneously in each of the other memory openings 49 and the support openings 19.

Figures 13A, 13B:
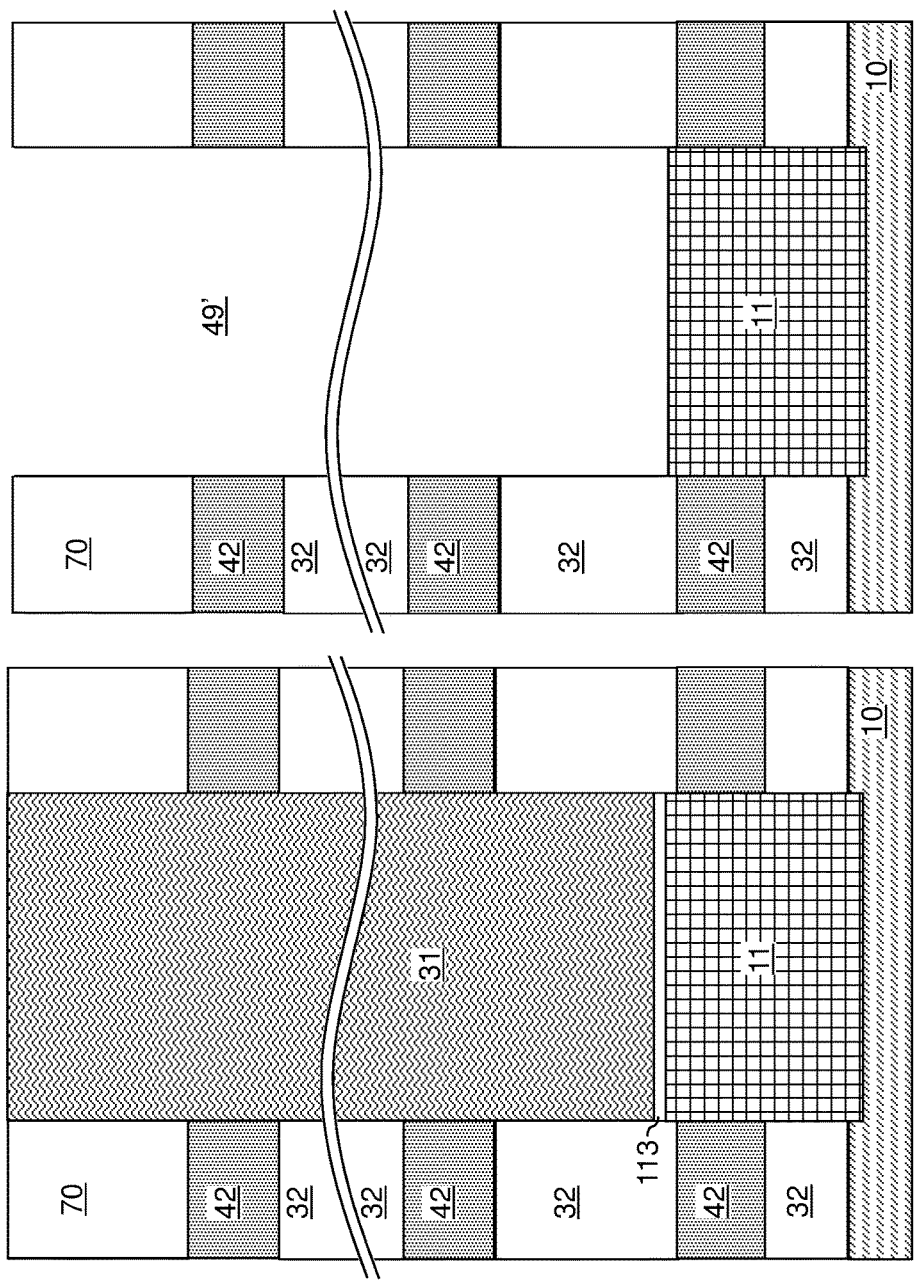

Referring to FIG. 13A, a memory opening 49 in the exemplary device structure of FIGS. 12A and 12B is illustrated. The memory opening 49 extends through the insulating cap layer 70, the alternating stack (32, 42), and optionally into an upper portion of the semiconductor material layer 10. Each memory opening 49 can be filled with a pedestal channel portion 11, a sacrificial semiconductor oxide plate 113, and a sacrificial memory opening fill structure 31. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed.

Referring to FIG. 13B, the memory opening fill structure 31 can be removed selective to the insulating cap layer 70, the alternating stack (32, 42), the drain select level isolation dielectric structures 124, and the sacrificial semiconductor oxide plate 113. For example, if the memory opening fill structure 31 includes amorphous silicon, a wet etch employing a KOH solution or a trimethyl-2 hydroxyethyl ammonium hydroxide (TMY) solution can be employed to remove the memory opening fill structure 31 selective to the insulating cap layer 70, the alternating stack (32, 42), the drain select level isolation dielectric structures 124, and the sacrificial semiconductor oxide plate 113. Subsequently, the sacrificial semiconductor oxide plate 113 can be removed by an isotropic etch (such as a wet etch employing dilute hydrofluoric acid) or an anisotropic etch.

Referring to FIG. 13C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A cavity 49' is formed in the volume of each memory opening 49 that is not filled with the deposited material layers (52, 54, 56, 601).

Referring to FIG. 13D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each cavity 49' can be removed to form openings in remaining portions thereof. Each of the first semiconductor channel layer 601, the tunneling dielectric layer 56, the charge storage layer 54, and the blocking dielectric layer 52 can be etched by anisotropic etch process.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor substrate layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the pedestal channel portion 11 (or of the semiconductor substrate layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 13E, a second semiconductor channel layer 602 can be deposited directly on the semiconductor surface of the pedestal channel portion 11 (or the semiconductor substrate layer 10 if portion 11 is omitted), and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may fully fill the cavity in each memory opening 49.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 13F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 13G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 13H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63).

Figure 14:
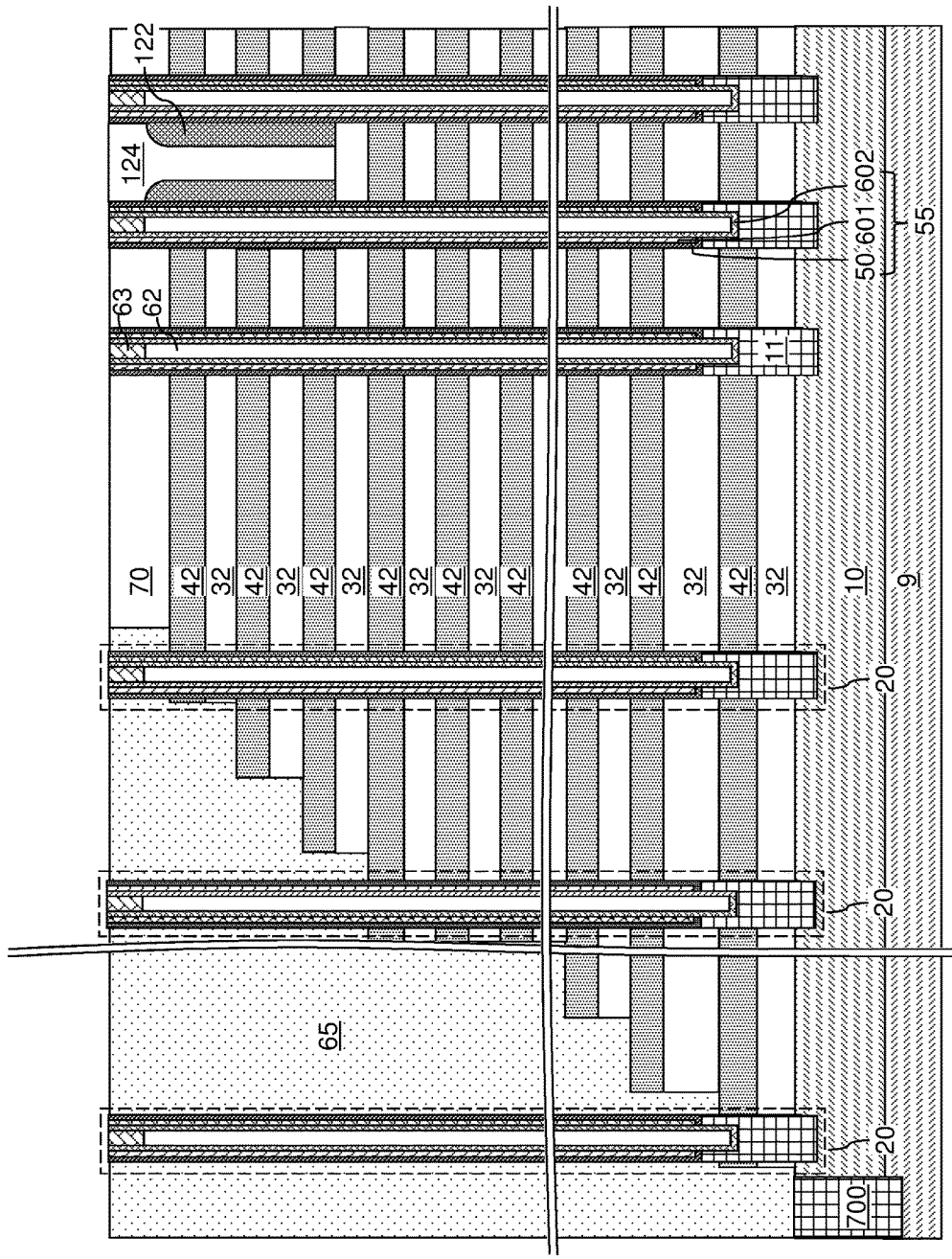
FIG. 14 is a vertical cross-sectional view of the exemplary structure after formation of the memory stack structures according to an embodiment of the present disclosure.

Referring to FIG. 14, the exemplary structure is illustrated after the processing steps of FIG. 13H. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure 20.

Figure 15A:
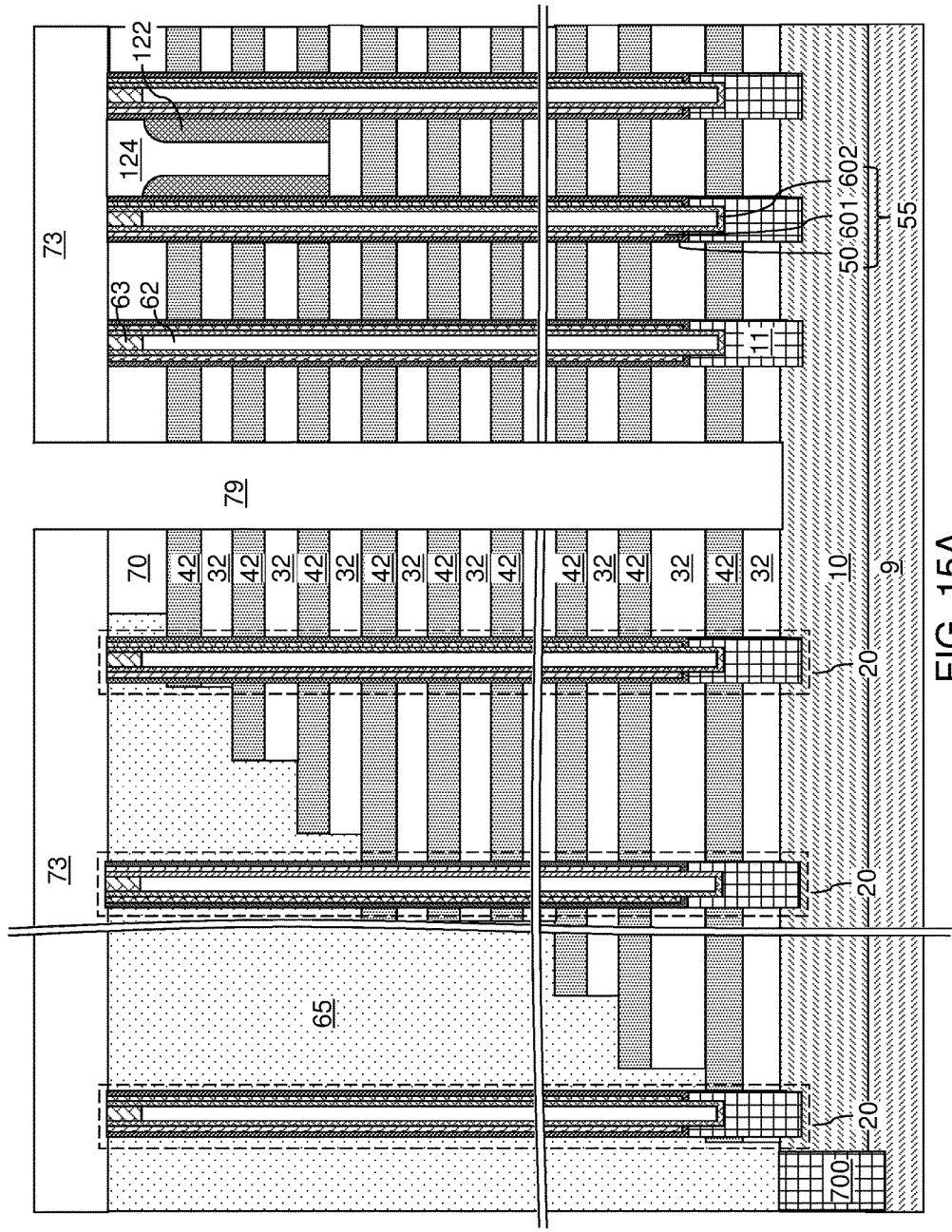
FIG. 15A is a vertical cross-sectional view of the exemplary structure after formation of backside trenches according to an embodiment of the present disclosure.
Figure 15B:
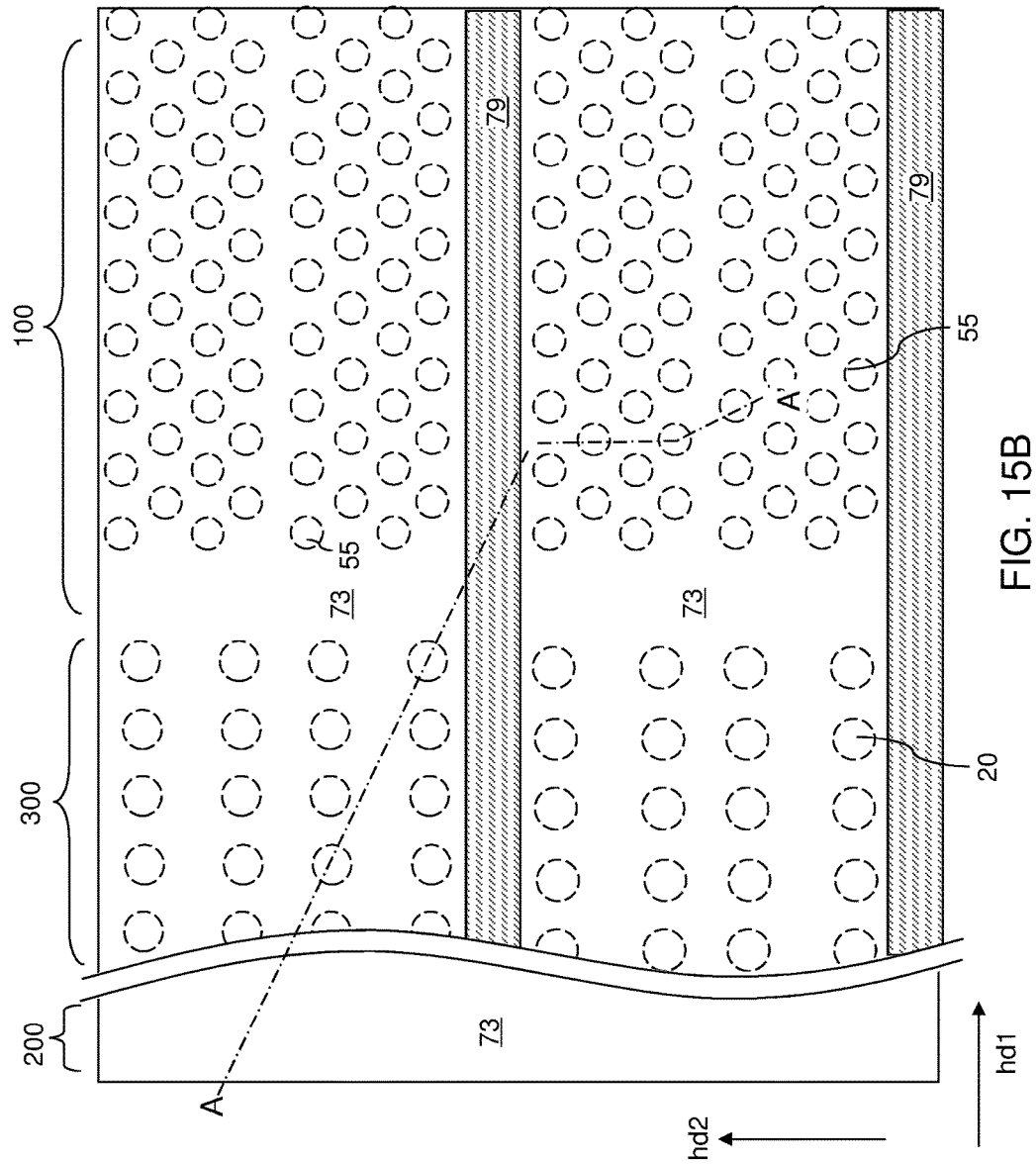
FIG. 15B is a top-down view of the exemplary structure of FIG. 15A. The vertical plane A-A' is the plane of the vertical cross-sectional view of FIG. 15A.

Referring to FIGS. 15A and 15B, a drain level dielectric material layer 73 can be formed over the insulating cap layer 70 and the retro-stepped dielectric material portion 65. The drain level dielectric material layer 73 includes a dielectric material such as silicon oxide, organosilicate glass, silicon nitride, or a combination thereof. In one embodiment, the drain level dielectric material layer 73 can include silicon oxide. The thickness of the drain level dielectric material layer 73 can be in a range from 30 nm to 600 nm, such as from 60 nm to 300 nm, although lesser and greater thicknesses can also be employed.

A photoresist layer (not shown) can be applied over the drain level dielectric material layer 73, and is lithographically patterned to form openings in areas between blocks of memory stack structures 55. The pattern in the photoresist layer can be transferred through the drain level dielectric material layer 73, the insulating cap layer 70, the alternating stack (32, 42), and/or the retro-stepped dielectric material portion 65 employing an anisotropic etch to form backside trenches 79. The backside trenches 79 vertically extend at least to the top surface of the substrate (9, 10), and laterally extend through the memory array region 100 and the contact region 300.

Each subset of memory stack structures 55 located between a neighboring pair of backside trenches 79 constitutes a block of memory stack structures 55. Each subset of memory stack structures 55 located between a neighboring pair among the entire set of backside trenches 79 and the drain select level isolation dielectric structures 124 constitutes a sub-block of memory stack structures 55. Each block of memory stack structures 55 includes two or more sub-blocks of memory stack structures 55. Subsequently, the sacrificial material layers 42 and the sacrificial spacers 122 are with conductive material portions.

Figure 16:
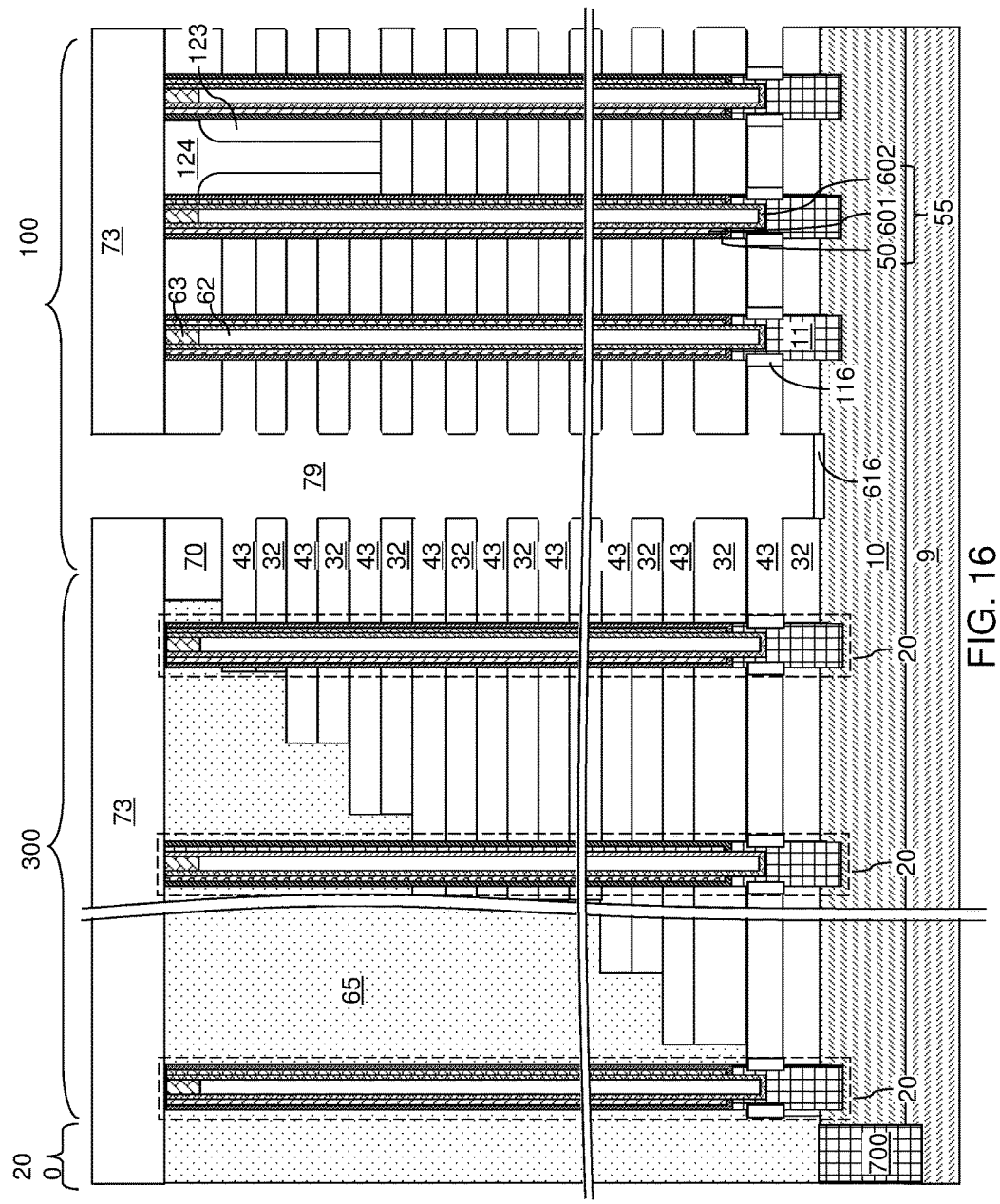
FIG. 16 is a vertical cross-sectional view of the exemplary structure after formation of backside recesses by removal of the sacrificial material layers with respect to the insulating layers according to an embodiment of the present disclosure.

Referring to FIGS. 16 and 17A, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. Laterally undulating cavities 123 extending through each of the drain select levels and laterally extending along the first horizontal direction hd1 can be formed in volumes from which the sacrificial spacers 122 are removed. The sacrificial material layers 42 and the sacrificial spacers 122 can be removed during the same isotropic etch process.

The removal of the second material of the sacrificial material layers 42 and the material of the sacrificial spacers 122 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 and the sacrificial spacers 122 can include silicon nitride, and the materials of the insulating layers 32, the support pillar structure 20, and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each laterally undulating cavity 123 can have a uniform width at each level of the insulating layers 32 located between a pair of drain select levels. Each sacrificial spacer 122 has the same shape as a laterally undulating cavity 123 that is formed by removal of the sacrificial spacer 122. As such, each laterally undulating cavity 123 has a laterally undulating horizontal cross-sectional shape and a uniform width, which the width of the sacrificial spacers 122.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 17B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

The backside blocking dielectric layer 44 can be formed in the backside recesses 43, in the laterally undulating cavities 123, and on a sidewall of the backside trench 79. The backside blocking dielectric layer 44 can be formed directly on horizontal surfaces of the insulating layers 32, directly on physically exposed sidewalls of the drain select level isolation dielectric structures 124 and physically exposed sidewalls of the insulating layers 32 around each laterally insulating cavity 123, and sidewalls of the memory stack structures 55 within the backside recesses 43. The backside blocking dielectric layer 44 can be formed as a single continuous material layer. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer.

Referring to FIG. 17C, a metallic barrier layer 46A can be deposited in the backside recesses 43, in the laterally undulating cavities 123, on the sidewalls of the at least one the backside trench 79, and over the top surface of the contact level dielectric layer 73. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIGS. 17D and 18A-18C, a metal fill material is deposited on the physically exposed surfaces of the metallic barrier layer 46A to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

Deposition of the at least one conductive material (such as the material of the metallic barrier layer 46A and the metallic fill material layer 46B) simultaneously forms electrically conductive layers 46, conductive connector spacers 126, and a continuous metallic material layer 46L. A plurality of electrically conductive layers 46 can be formed in the plurality of backside recesses 43. A plurality of conductive connector spacers 126 can be formed in the plurality of laterally undulating cavities 123. A continuous metallic material layer 46L can be formed on the sidewalls of each backside trench 79 and over the contact level dielectric layer 73. Each of the electrically conductive layers 46, the conductive connector spacers 126, and the continuous metallic material layer 46L includes a respective portion of the metallic barrier layer 46A and a respective portion of the metallic fill material layer 46B.

The electrically conductive layers 46 are formed within volumes of the sacrificial material layers 42. The conductive connector spacers 126 are formed within volumes of the sacrificial spacers 122. Each of the conductive connector spacers 126 provides electrical connection among two or more uppermost layers of the electrically conductive layers 46, which are drain select level electrically conductive layers.

A pair of conductive connector spacers 126 and a drain select level isolation dielectric structure 124 are formed within each drain select level isolation trench 119. The pair of conductive connector spacers 126 comprise a first conductive connector spacer and a second conductive connector spacer that are laterally spaced from, and electrically isolated from, each other by the drain select level isolation dielectric structure 124. The first conductive connector spacer 126 and first strip portions of the two or more uppermost layers 46SGD (e.g., drain select gate electrodes) among the electrically conductive layers 46 are formed as a first continuous conductive structure. The second conductive connector spacer and second strip portions of the two or more uppermost layers 46SGD among the electrically conductive layers 46 are formed as a second continuous conductive structure. One or more of the lowermost layers 46SGS among the electrically conductive layers 46 form a source select gate electrode(s). The remaining electrically conductive layers 46WL function as word lines/control gate electrodes.

The insulating layers 32 and the electrically conductive layers 46 form alternating stacks (32, 46). A plurality of alternating stacks (32, 46) is formed such that each alternating stack (32, 46) is laterally spaced from neighboring alternating stacks (32, 46) by a backside trench 79. In one embodiment, a pair of backside trenches 79 can laterally extend along a lengthwise direction of the drain select level isolation dielectric structure 124, i.e., the first horizontal direction hd1 (e.g., word line direction). In one embodiment, the first strip portions are formed between the drain select level isolation dielectric structure 124 and one of the pair of backside trenches 79, and the second strip portions are formed between the drain select level isolation dielectric structure 124 and another of the pair of backside trenches 79.

Thus, each sacrificial material layer 42 can be replaced with an electrically conductive layer 46. Each sacrificial spacer 122 can be replaced with a conductive connector spacer 126. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 19:
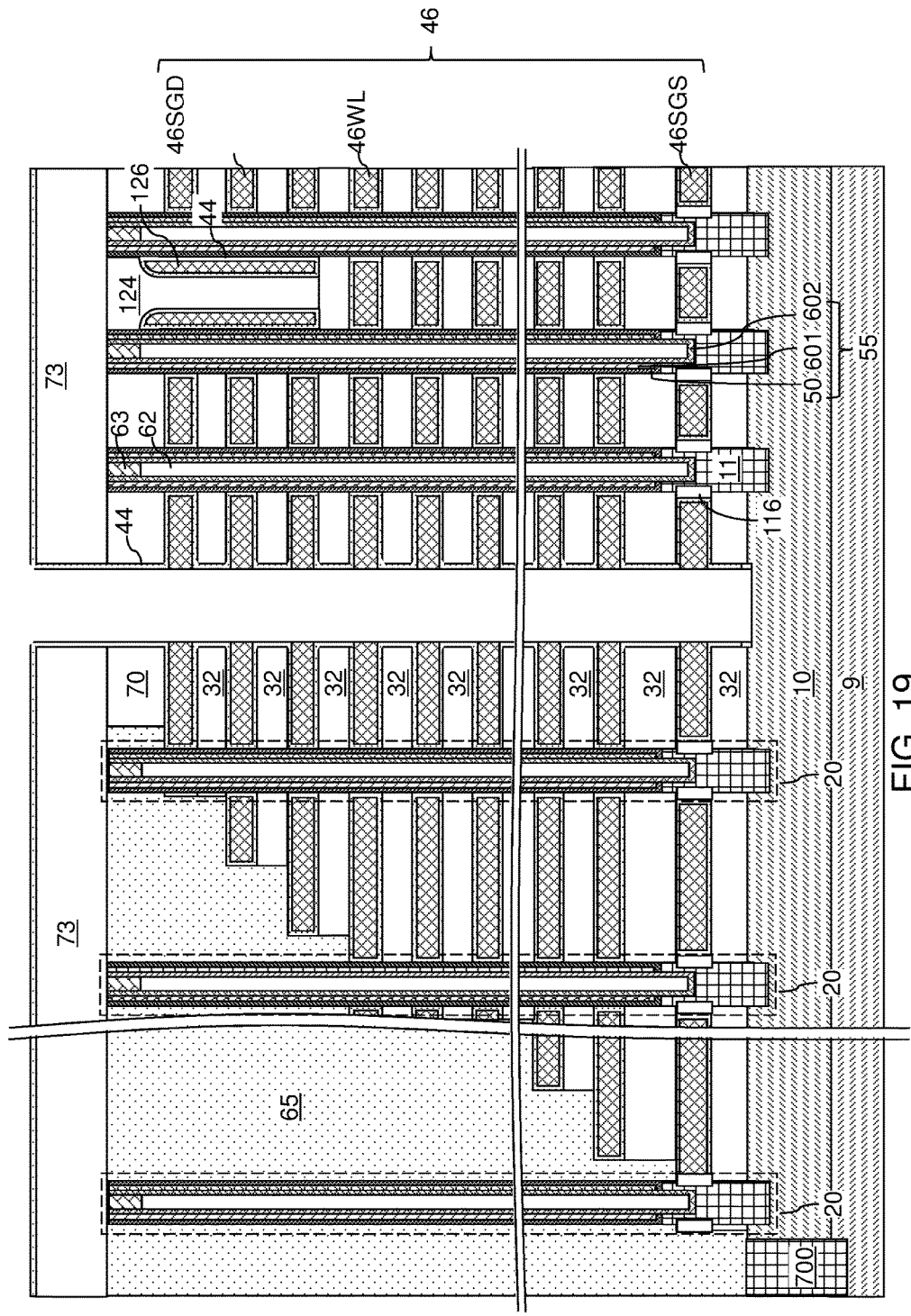
FIG. 19 is a vertical cross-sectional view of the exemplary structure after removal of a deposited conductive material from within the backside trenches according to an embodiment of the present disclosure.

Referring to FIG. 19, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Figure 20A:
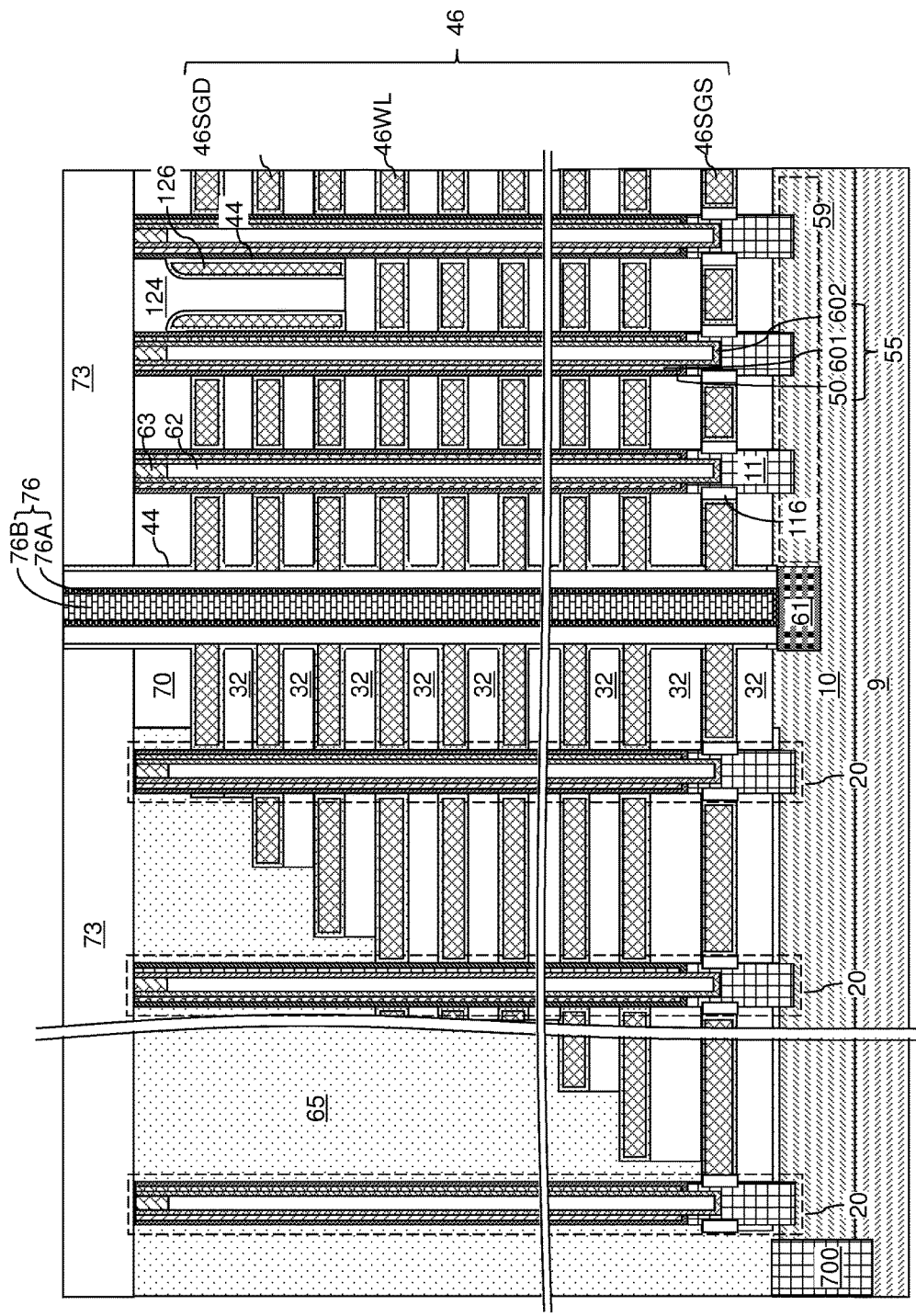
FIG. 20A is a vertical cross-sectional view of the exemplary structure after formation of an insulating spacer and a backside contact structure within each backside trench according to an embodiment of the present disclosure.
Figure 20B:
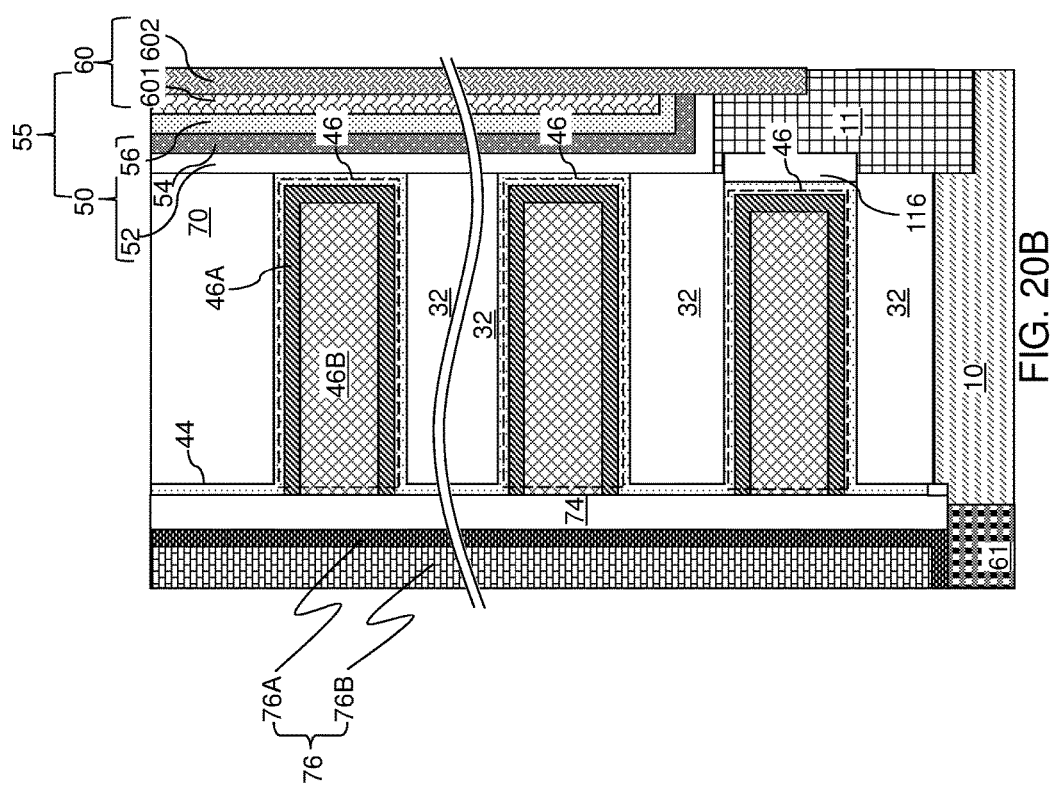
FIG. 20B is a vertical cross-sectional view of a region of the exemplary structure of FIG. 20A between a backside trench and a memory opening.

Referring to FIGS. 20A and 20B, an insulating material layer can be formed in the at least one backside contact trench 79 and over the drain level dielectric material layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LP-CVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the drain level dielectric material layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. A top surface of the semiconductor material layer 10 can be physically exposed at the bottom of each backside contact trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74. Each source region 61 can have a doping of a second conductivity type, which is the opposite of the first conductivity type. For example, if the first conductivity type is p-type, the second conductivity type is n-type, and vice versa.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10).

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the drain level dielectric material layer 73 overlying the alternating stack (32, 46) as a stopping layer. If chemical mechanical planarization (CMP) process is employed, the drain level dielectric material layer 73 can be employed as a CMP stopping layer. Each remaining continuous portion of the at least one conductive material in the backside contact trenches 79 constitutes a backside contact via structure 76. The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 21A:
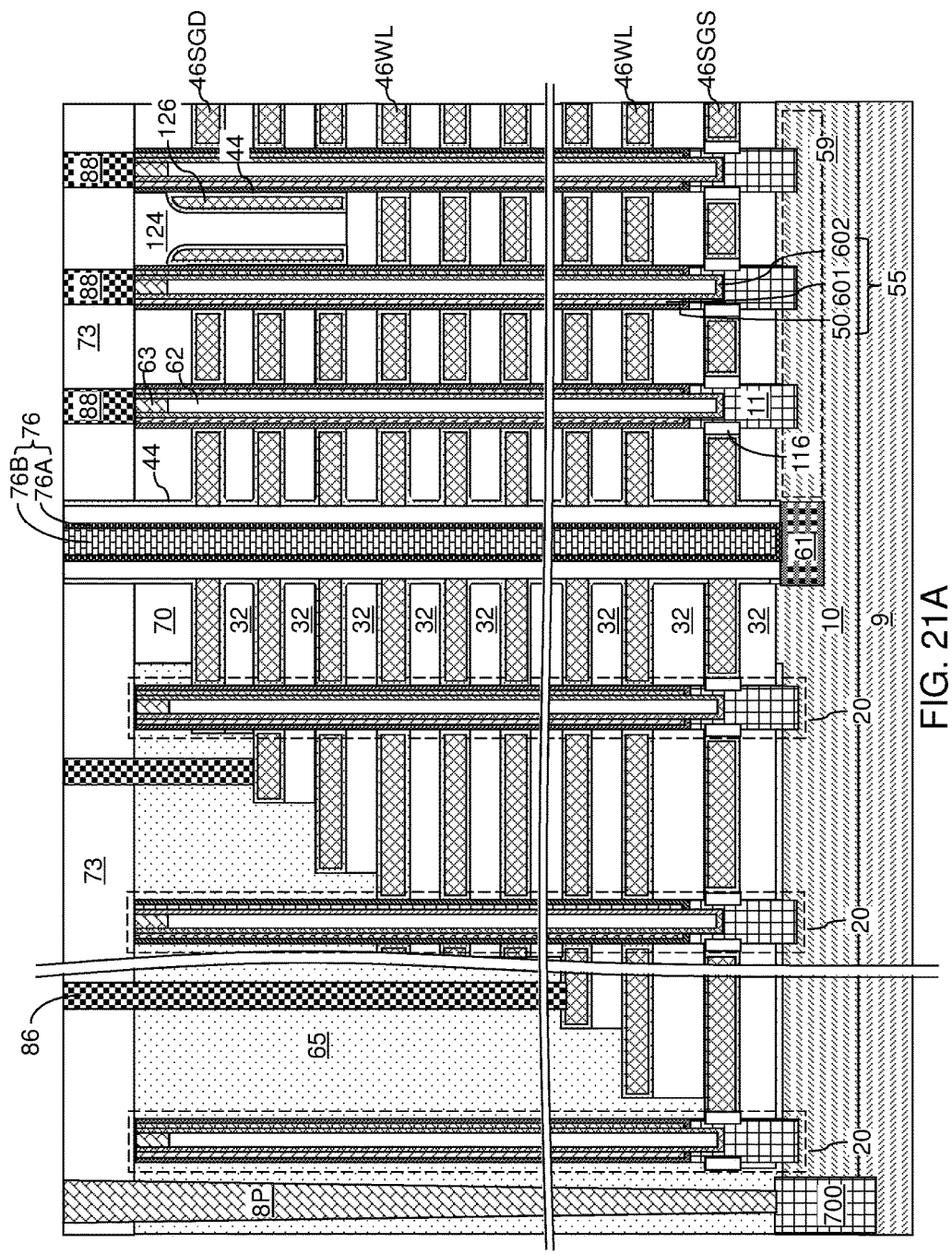
FIG. 21A is a vertical cross-sectional view of the exemplary structure after formation of additional contact via structures according to an embodiment of the present disclosure.
Figure 21B:
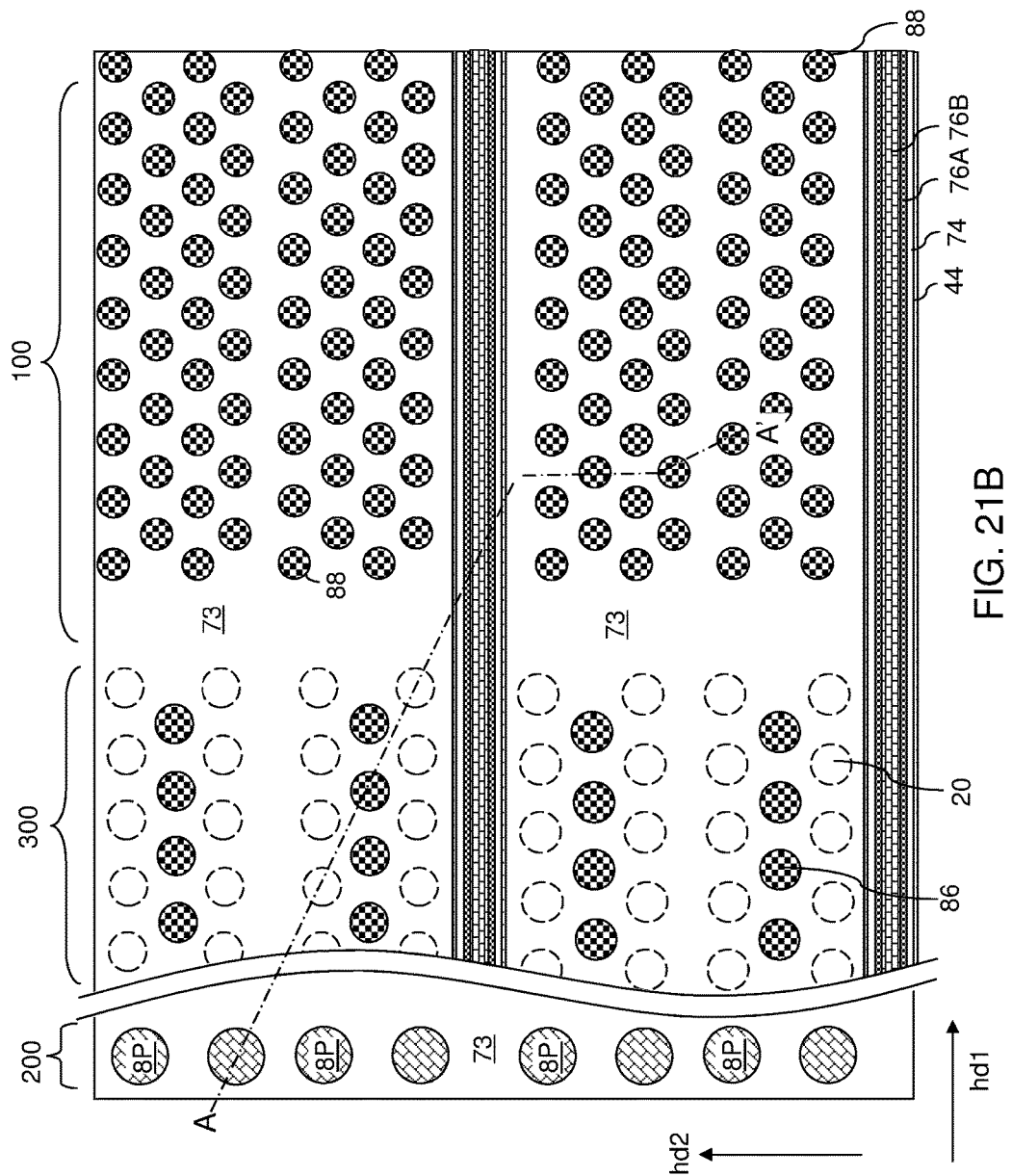
FIG. 21B is a top-down view of the exemplary structure of FIG. 21A. The vertical plane A-A' is the plane of the vertical cross-sectional view of FIG. 21A.

Referring to FIGS. 21A and 21B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Figure 18A:
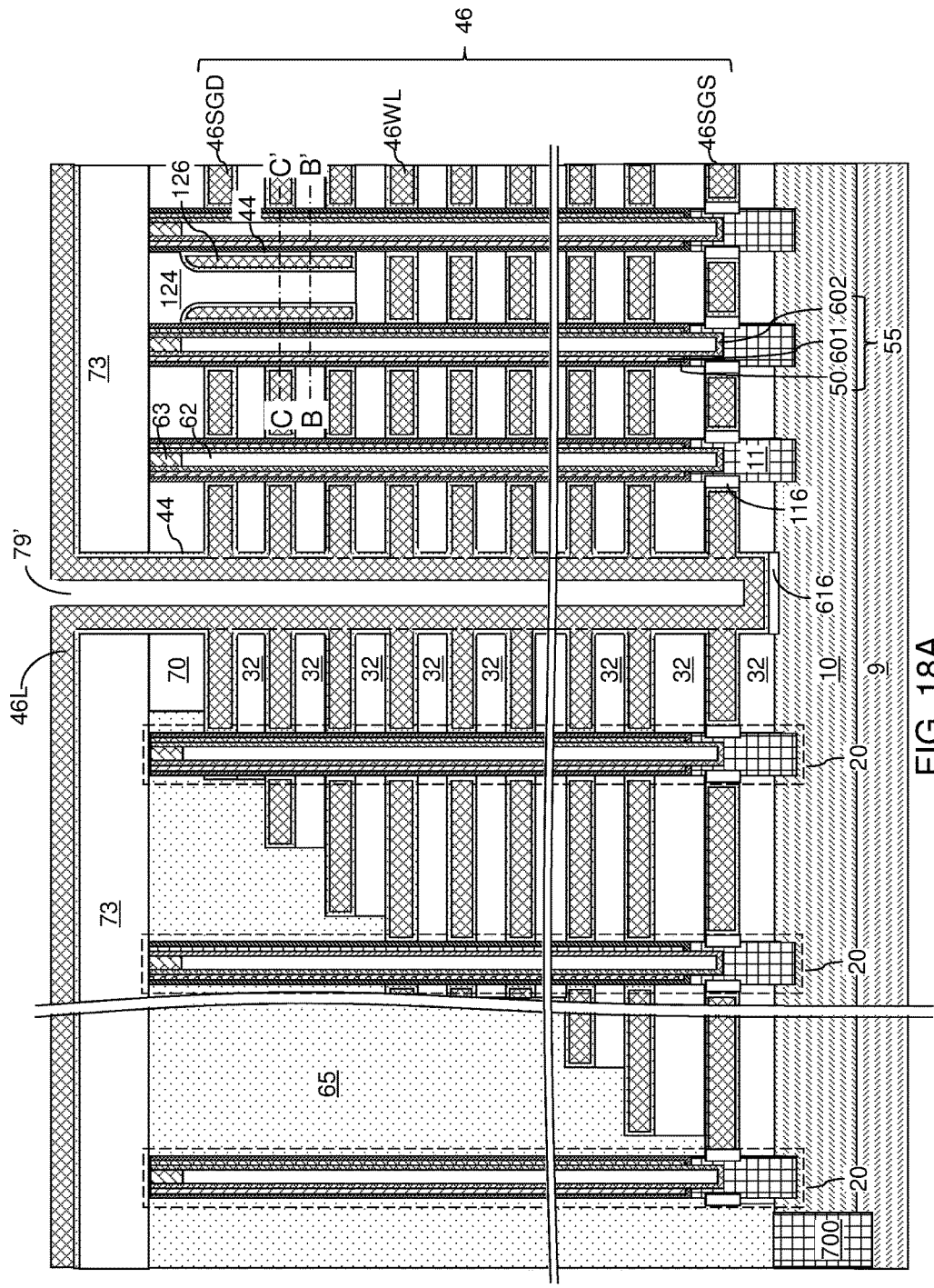
FIG. 18A is a vertical cross-sectional view of the exemplary structure at the processing step of FIG. 17D.
Figure 18B:
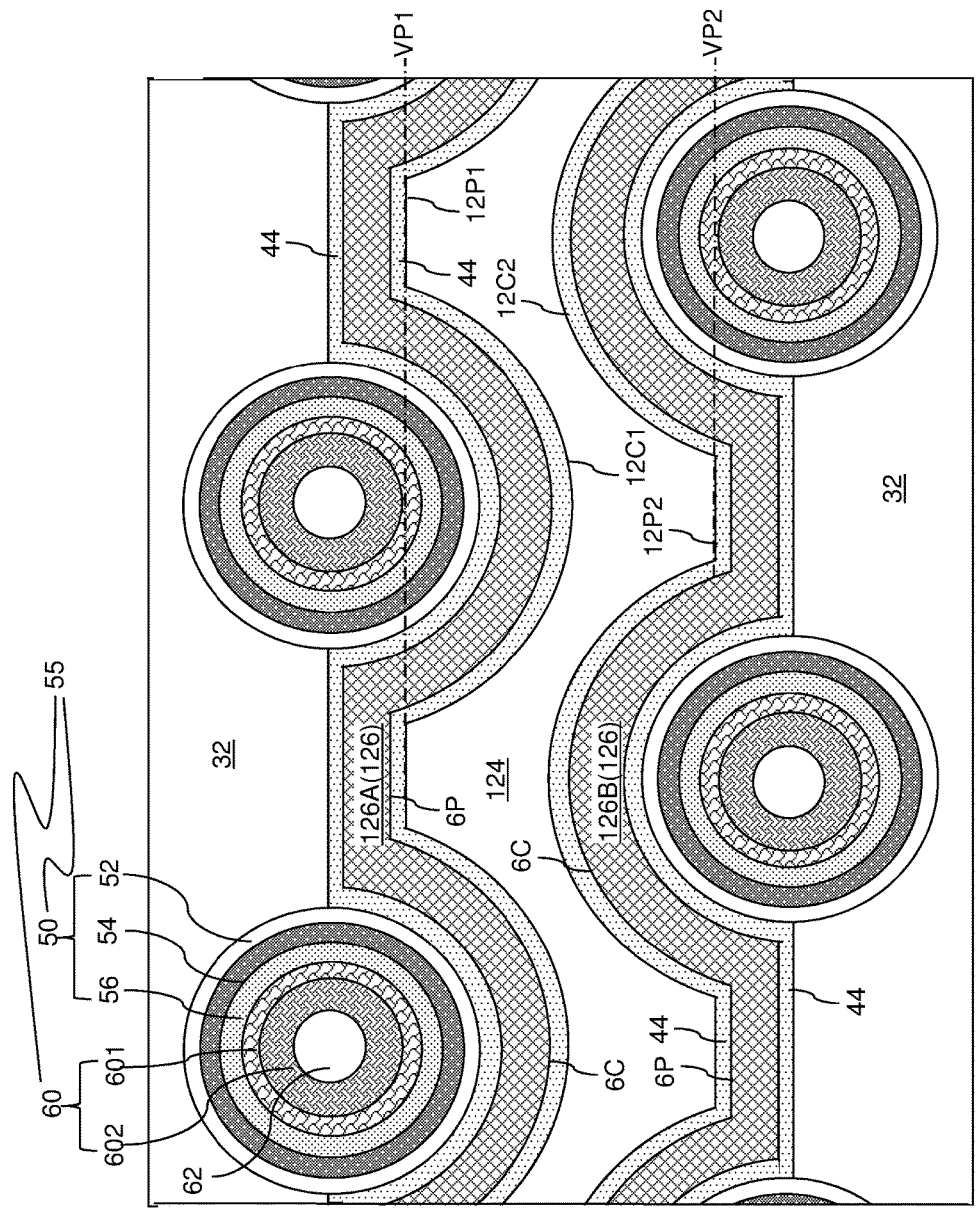
FIG. 18B is a horizontal cross-sectional view of a region of the exemplary structure along a horizontal plane B-B' in FIG. 18A.
Figure 18C:
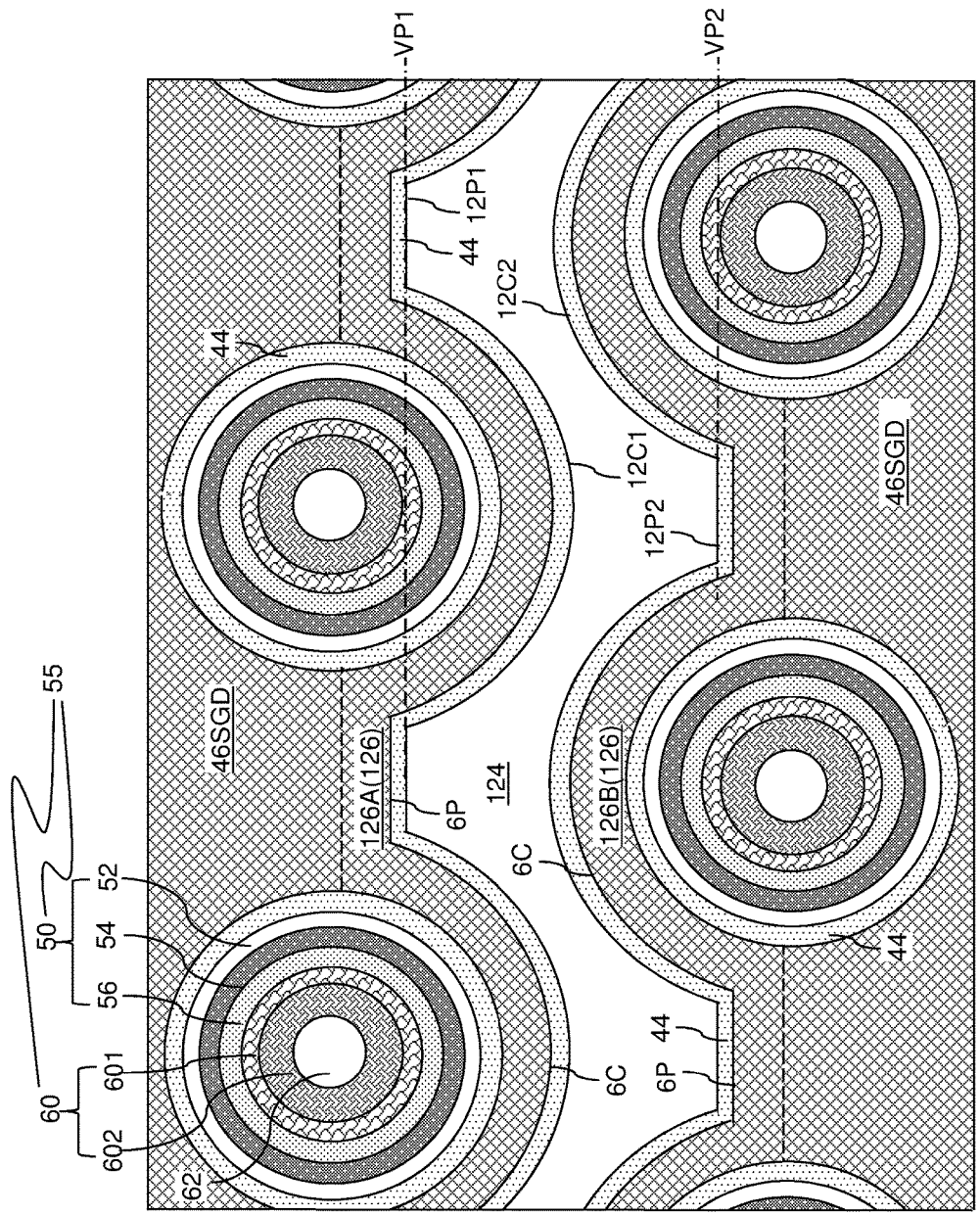
FIG. 18C is a horizontal cross-sectional view of a region of the exemplary structure along a horizontal plane C-C' in FIG. 18A.

Referring to all figures of the present disclosure, a three-dimensional memory device is provided, which comprises an alternating stack of insulating layers 32 and electrically conductive layers 46 located over a substrate (9, 10), and memory stack structures 55 extending through the alternating stack (32, 46). Each of the memory stack structures 55 comprises a memory film 50 and a vertical semiconductor channel 60 contacting an inner sidewall of the memory film 50. Two or more uppermost layers 46SGD among the electrically conductive layers 46 include first strip portions and second strip portions that are laterally spaced from one another by a drain select level isolation dielectric structure 124. The drain select level isolation dielectric structure 124 can include a pair of alternating sequences of non-concave (e.g., planar or convex) sidewall portions (12P1 or 12P2) and concave sidewall portions (12C1 or 12C2), as illustrated in FIGS. 18B and 18C. Each of the concave sidewall portions (12C1, 12C2) is equidistant from a sidewall of a respective one of the memory stack structures 55.

In one embodiment, the pair of alternating sequences of non-concave (e.g., planar or convex) sidewall portions (12P1 or 12P2) and concave sidewall portions (12C1 or 12C2) comprises: a first alternating sequence of first planar sidewall portions 12P1 and first concave sidewall portions 12C1, and a second alternating sequence of second planar sidewall portions 12P2 and second concave sidewall portions 12C2. In one embodiment, the first planar sidewall portions 12P1 are located within a first vertical plane VP1, and the second planar sidewall portions 12P2 are located within a second vertical plane VP2 that is parallel to the first vertical plane VP1 as illustrated in FIGS. 18B and 18C.

In one embodiment, the two or more uppermost layers 46SGD among the electrically conductive layers 46 comprise drain select level electrically conductive layers, and a subset of the electrically conductive layers 46 that underlies the two or more uppermost layers among the electrically conductive layers 46 comprises word line electrically conductive layers 46WL of the memory stack structures 55.

In one embodiment, the three-dimensional memory device can further comprise: a first conductive connector spacer 126A connected to each of the first strip portions of the two or more uppermost layers 46SGD among the electrically conductive layers 46, and a second conductive connector spacer 126B connected to each of the second strip portions of the two or more uppermost layers 46SGD among the electrically conductive layers 46 as illustrated in FIG. 18C.

In one embodiment, each of the first and second conductive connector spacers (126A, 126B) includes an alternating sequence of conductive non-concave (e.g., planar or convex) sidewall portions 6P and conductive concave sidewall portions 6C that are equidistant from a respective one of the memory stack structures 55, as illustrated in FIGS. 18B and 18C. In one embodiment, the first and second conductive connector spacers (126A, 126B) comprise a same material as the electrically conductive layers 46.

In one embodiment, the three-dimensional memory device further comprises a backside blocking dielectric layer 44 including horizontal portions located between each neighboring pair of the insulating layers 32 and the electrically conductive layers 46 and vertical portions located between the drain select level isolation dielectric structure 124 and the first and second conductive connector spacers (126A, 126B). In one embodiment, the backside blocking dielectric layer 44 further comprises additional vertical portions contacting sidewalls of a subset of the insulating layers 32 located between a bottommost layer among the two or more uppermost layers 46SGD among the electrically conductive layers 46 and a topmost layer among the two or more uppermost layers 46SGD among the electrically conductive layers 46, i.e., between a bottommost drain select level electrically conductive layer 46SGD and a topmost drain select level electrically conductive layer 46SGD, as shown in FIG. 18B.

In one embodiment, the first conductive connector spacer 126A and the first strip portions of the two or more uppermost layers 46SGD among the electrically conductive layers 46 constitute a first continuous conductive structure, and the second conductive connector spacer 126B and the second strip portions of the two or more uppermost layers 46SGD among the electrically conductive layers 46 constitute a second continuous conductive structure.

In one embodiment, the three-dimensional memory device can further comprise a pair of backside trenches 79 vertically extending through the alternating stacks (32, 46) and laterally extending along a lengthwise direction of the drain select level isolation dielectric structure 124. The first strip portions are located between the drain select level isolation dielectric structure 124 and one of the pair of backside trenches 79, and the second strip portions are located between the drain select level isolation dielectric structure 124 and another of the pair of backside trenches 79.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46). The terrace region includes stepped surfaces of the alternating stack (32, 46) that continuously extend from a bottommost layer within the alternating stack (32, 46) to a topmost layer within the alternating stack (32, 46). Support pillar structures 20 extend through the stepped surfaces and through a retro-stepped dielectric material portion 65 that overlies the stepped surfaces.

The exemplary structure can include a three-dimensional memory device. In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46WL) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit for the memory device located thereon. The electrically conductive layers 46WL can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion (60) of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Embodiments of the present disclosure provide drain select gate electrodes that are located at multiple levels and electrically shorted among one another by a respective conductive connector spacer 126. Each conductive connector spacer 126 is self-aligned to memory stack structures 55 and laterally spaced from a neighboring conducive connector spacer 124 by a drain select level isolation dielectric structure 124. The drain select level isolation dielectric structure 124 is self-aligned to the conductive connector spacers 126 and the memory stack structures 55. The multiple levels of the drain select gate electrodes lower the total resistance of the drain select gate electrodes. Self-alignment of the conductive connector spacers 126 to the memory stack structures 55 minimizes the volume occupied by the drain select level isolation dielectric structures 124, and thus, provides a more compact design layout for a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
   an alternating stack of insulating layers and electrically conductive layers located over a substrate;
   a drain select level isolation dielectric structure; and
   memory stack structures extending through the alternating stack, wherein each of the memory stack structures comprises a memory film and a vertical semiconductor channel contacting an inner sidewall of the memory film,
   wherein:
   two or more uppermost layers among the electrically conductive layers include first strip portions and second strip portions that are laterally spaced from one another by the drain select level isolation dielectric structure; and
   the drain select level isolation dielectric structure includes a pair of alternating sequences of non-concave sidewall portions and concave sidewall portions.

2. The three-dimensional memory device of claim 1, the pair of alternating sequences of non-concave sidewall portions and concave sidewall portions comprises:
   a first alternating sequence of first planar sidewall portions and first concave sidewall portions; and
   a second alternating sequence of second planar sidewall portions and second concave sidewall portions,
   wherein:
   the first planar sidewall portions are located within a first vertical plane; and
   the second planar sidewall portions are located within a second vertical plane that is parallel to the first vertical plane.

3. The three-dimensional memory device of claim 1, wherein:
   each of the concave sidewall portions is equidistant from a sidewall of a respective one of the memory stack structures;
   the two or more uppermost layers among the electrically conductive layers comprise drain select level electrically conductive layers; and
   a subset of the electrically conductive layers that underlies the two or more uppermost layers among the electrically conductive layers comprises word line electrically conductive layers of the memory stack structures.

4. The three-dimensional memory device of claim 1, further comprising:
   a first conductive connector spacer connected to each of the first strip portions of the two or more uppermost layers among the electrically conductive layers; and
   a second conductive connector spacer connected to each of the second strip portions of the two or more uppermost layers among the electrically conductive layers.

5. The three-dimensional memory device of claim 4, wherein each of the first and second conductive connector spacers includes an alternating sequence of conductive non-concave sidewall portions and conductive concave sidewall portions.

6. The three-dimensional memory device of claim 4, wherein the first and second conductive connector spacers comprise a same material as the electrically conductive layers.

7. The three-dimensional memory device of claim 4, further comprising a backside blocking dielectric layer including horizontal portions located between each neighboring pair of the insulating layers and the electrically conductive layers and vertical portions located between the drain select level isolation dielectric structure and the first and second conductive connector spacers.

8. The three-dimensional memory device of claim 7, wherein the backside blocking dielectric layer further comprises additional vertical portions contacting sidewalls of a subset of the insulating layers located between a bottommost layer among the two or more uppermost layers among the electrically conductive layers and a topmost layer among the two or more uppermost layers among the electrically conductive layers.

9. The three-dimensional memory device of claim 4, wherein:
   the first conductive connector spacer and the first strip portions of the two or more uppermost layers among the electrically conductive layers constitute a first continuous conductive structure; and
   the second conductive connector spacer and the second strip portions of the two or more uppermost layers among the electrically conductive layers constitute a second continuous conductive structure.

10. The three-dimensional memory device of claim 1, further comprising a pair of backside trenches vertically extending through the alternating stack and laterally extending along a lengthwise direction of the drain select level isolation dielectric structure,
    wherein:

the first strip portions are located between the drain select level isolation dielectric structure and one of the pair of backside trenches; and the second strip portions are located between the drain select level isolation dielectric structure and another of the pair of backside trenches.

11. The three-dimensional memory device of claim 1, wherein:

the three-dimensional memory device comprises a monolithic three-dimensional NAND memory device;

a subset of the electrically conductive layers comprises, or is electrically connected to, a respective word line of the monolithic three-dimensional NAND memory device;

the substrate comprises a silicon substrate;

the monolithic three-dimensional NAND memory device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon;

the electrically conductive layers comprise a plurality of control gate electrodes having a strip shape extending substantially parallel to the top surface of the substrate, and the plurality of control gate electrodes comprises at least a first control gate electrode located in the first device level and a second control gate electrode located in the second device level; and the array of monolithic three-dimensional NAND strings comprises:

a plurality of semiconductor channels, wherein at least one end portion of each of the plurality of semiconductor channels extends substantially perpendicular to a top surface of the substrate, and a plurality of charge storage elements, each charge storage element located adjacent to a respective one of the plurality of semiconductor channels.

12. A three-dimensional memory device comprising:

an alternating stack of insulating layers and electrically conductive layers located over a substrate;

memory stack structures extending through the alternating stack, wherein each of the memory stack structures comprises a memory film and a vertical semiconductor channel contacting an inner sidewall of the memory film;

a first conductive connector spacer connected to each of first strip portions of two or more uppermost layers among the electrically conductive layers; and a second conductive connector spacer connected to each of second strip portions of the two or more uppermost layers among the electrically conductive layers, wherein each of the first and second conductive connector spacers includes an alternating sequence of conductive non-concave sidewall portions and conductive concave sidewall portions.

* * * * *